(12) United States Patent
Sampath

(10) Patent No.: US 9,894,797 B2
(45) Date of Patent: Feb. 13, 2018

(54) APPARATUSES FOR MANIPULATING POWER SWITCH OF ELECTRONIC DEVICE LOCATED IN REMOTE POSITION WITHIN STORAGE CABINET

(71) Applicant: Oracle International Corporation, Redwood City, CA (US)

(72) Inventor: Ramanan Sampath, San Francisco, CA (US)

(73) Assignee: Oracle International Corporation, Redwood City, CA (US)

( * ) Notice: Subject to any disclaimer, the term of this patent is extended or adjusted under 35 U.S.C. 154(b) by 190 days.

(21) Appl. No.: 14/997,025

(22) Filed: Jan. 15, 2016

(65) Prior Publication Data

US 2016/0351359 A1    Dec. 1, 2016

Related U.S. Application Data

(63) Continuation-in-part of application No. 14/725,680, filed on May 29, 2015, now Pat. No. 9,769,950.

(51) Int. Cl.
| | |
|---|---|
| *H01H 3/20* | (2006.01) |
| *H01H 17/00* | (2006.01) |
| *H05K 7/18* | (2006.01) |
| *G05G 1/54* | (2008.04) |

(52) U.S. Cl.
CPC ............. *H05K 7/18* (2013.01); *G05G 1/54* (2013.01); *H01H 2300/056* (2013.01)

(58) Field of Classification Search
CPC .. H01H 2300/056; H01H 19/00; H01H 21/00; H01H 15/00; H01H 3/00; H01H 3/02; H01H 3/20; H01H 3/001; H01H 3/3031; H01H 3/3042; H01H 3/32; H01H 3/38; H01H 3/54; H01H 9/0044; H01H 69/00; H01H 71/00; H01H 71/02; H01H 71/0214; H01H 71/025; H01H 71/0264; H01H 71/0271; H01H 71/10; H01H 71/1072; H01H 71/128; H01H 71/50; H01H 71/52; H01H 71/521; H01H 71/522; H01H 71/523; H01H 71/524; H01H 73/06; H01H 73/24; H01H 73/38; H01H 73/50; H01H 73/60; H01H 2003/02; H01H 33/6661; H01H 9/0016; H01H 9/0027;

(Continued)

(56) References Cited

U.S. PATENT DOCUMENTS

| | | | | |
|---|---|---|---|---|
| 5,422,453 A | * | 6/1995 | Smith | H01H 3/3021 |
| | | | | 200/329 |
| 8,817,464 B2 | | 8/2014 | Jau | |
| 2014/0027392 A1 | * | 1/2014 | Crippen | H05K 7/1488 |
| | | | | 211/26 |

* cited by examiner

*Primary Examiner* — Anthony R. Jimenez
(74) *Attorney, Agent, or Firm* — Marsh Fischmann & Breyfogle LLP; Jonathon A. Szumny

(57) ABSTRACT

Power switch manipulation apparatuses that allow users to manipulate power switches of FRUs mounted within storage racks in a manner free of a user having to physically reach into the storage rack to manipulate the power switches. One embodiment of the disclosed manipulation apparatus broadly includes a base member that may be rigidly secured to a portion of the frame of a storage rack (e.g., on a side or vertical member adjacent a rear door or opening of the rack at the same or similar height as at least one of the power switches) along with a tool that is movably mounted or mountable to the base member for manipulating a power switch of a FRU mounted in the rack.

20 Claims, 32 Drawing Sheets

(58) Field of Classification Search
CPC ......... H01H 9/0038; H01H 2009/0022; H01H 2009/0055; H05K 7/18; G05G 1/54; H01F 29/04
USPC ..................................................... 200/11 TC
See application file for complete search history.

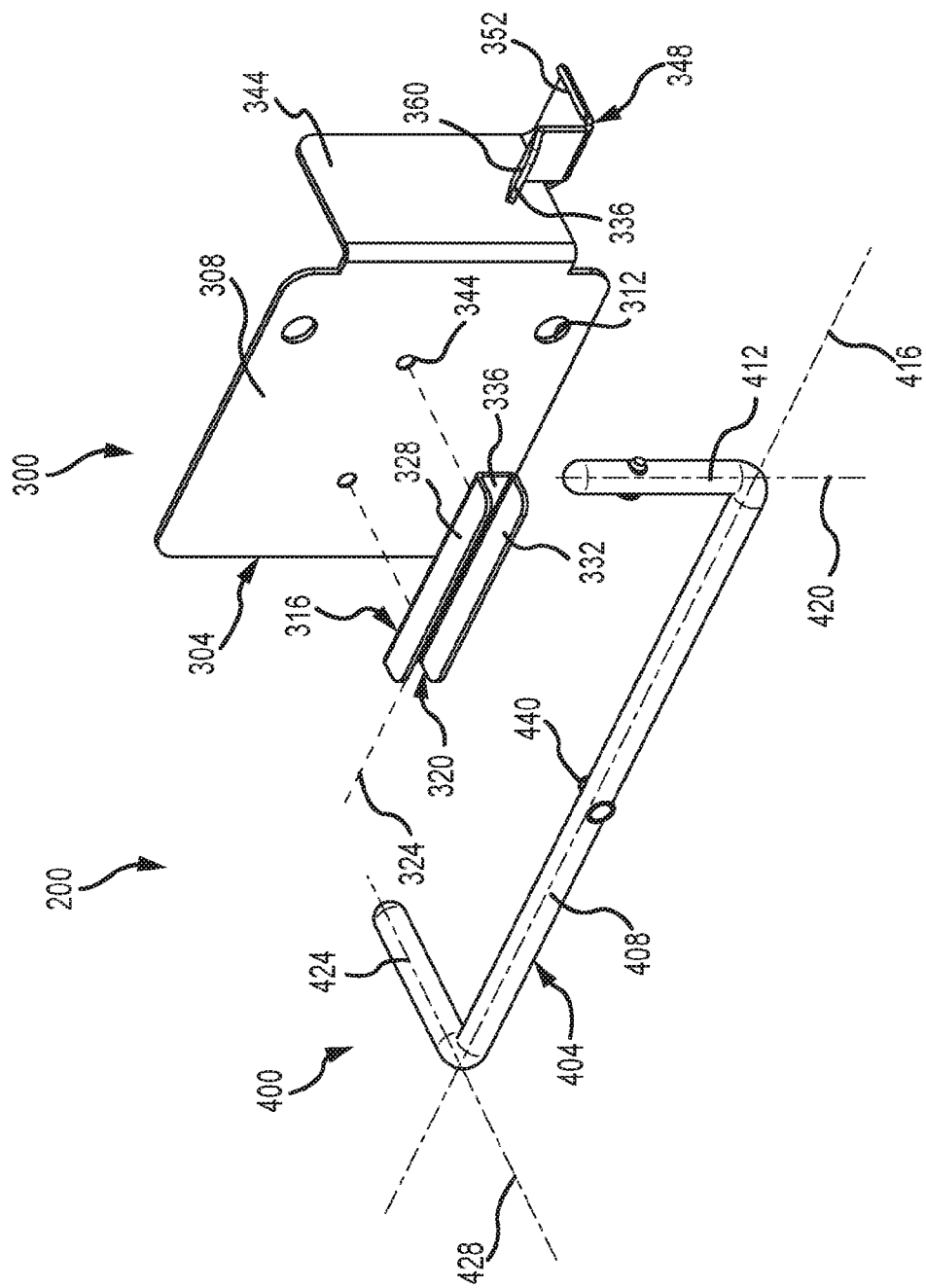

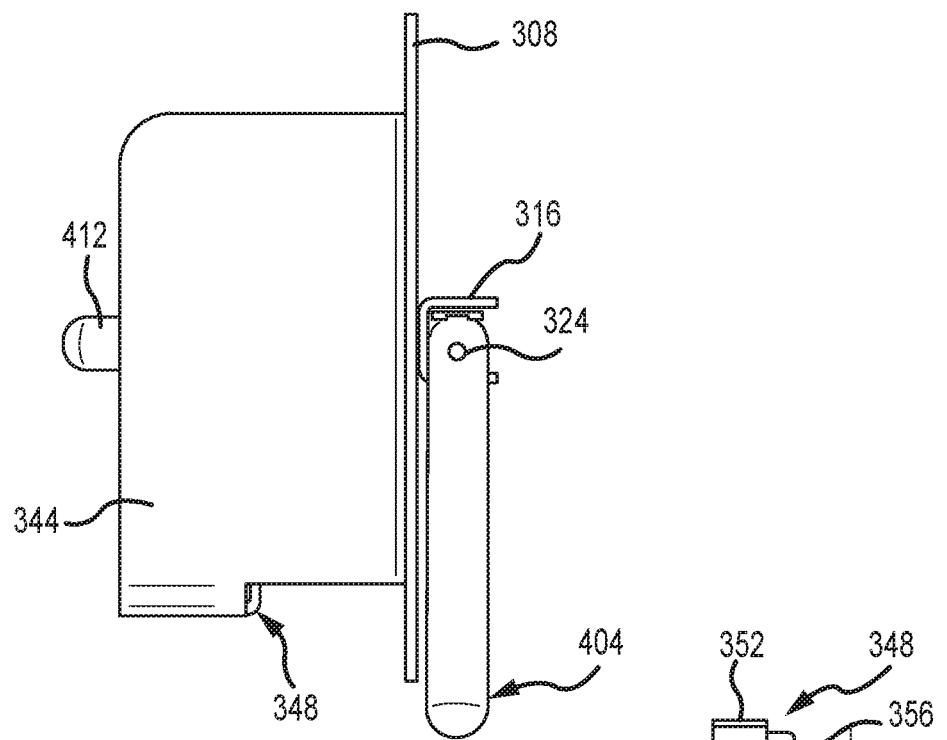
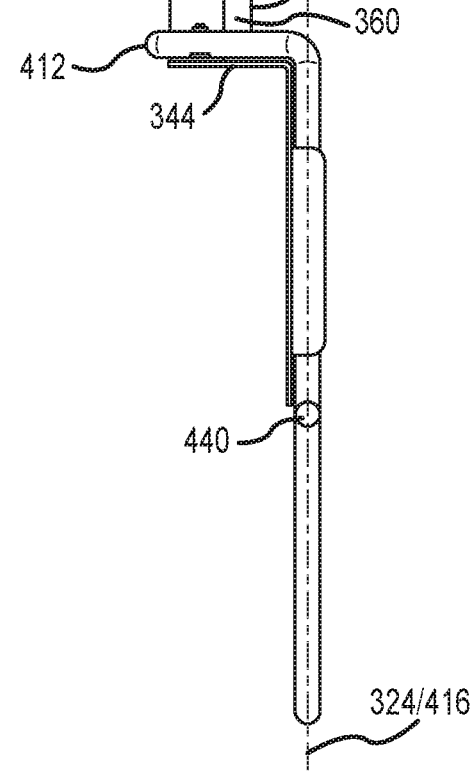
FIG.9a
FIG.9b

APPARATUSES FOR MANIPULATING POWER SWITCH OF ELECTRONIC DEVICE LOCATED IN REMOTE POSITION WITHIN STORAGE CABINET

CROSS REFERENCE TO RELATED APPLICATION

This application is a continuation-in-part of U.S. patent application Ser. No. 14/725,680, entitled "APPARATUSES FOR MANIPULATING POWER SWITCH OF ELECTRONIC DEVICE LOCATED IN REMOTE POSITION WITHIN STORAGE CABINET," and filed on May 29, 2015, the entirety of which is incorporated herein by reference as if set forth in full.

BACKGROUND

1. Field of the Invention

The present invention generally relates to storage racks or cabinets for storing electronic device such as computing devices (e.g., servers), power distribution units, and the like and, more particularly, to the manipulation of switches (e.g., power switches, circuit breaker switches, etc.) of electronic devices mounted within storage racks.

2. Relevant Background

Storage racks for electronic devices are typically standardized frames that are designed to hold a plurality of electronic devices or field replaceable units (FRUs) such as rack-mounted servers, power distribution units (PDUs) or backup devices, and/or the like. Generally, a storage rack includes a number of vertical posts or pillars (e.g., a pair of front pillars and a pair of rear pillars) to which horizontal members, rail assemblies, paneling and the like can be secured (e.g., collectively, a "frame") to define an interior space made up of a plurality of receiving bays for receiving FRUs. Various types and sizes of FRUs may be installed within a rack system and often have standardized heights as multiples of one rack unit (U). For instance, industry standard rack systems often come in heights of 18U, 22U, 36U, 42U, and the like. In high availability environments (e.g., telecommunications systems), the set of FRUs (e.g., computing devices, related components, and the like) in a frame configuration may be administered as a single compute system that is functionally consistent with administration of a single FRU.

Each FRU has a power switch that can be manipulated between or among a number of positions to power on and power off the FRU as appropriate by operators and technicians. The power switch is often electrically interconnected to a circuit breaker that is configured to automatically manipulate (e.g., flip) the power switch into an intermediate position to interrupt current flow to the FRU upon detection of a fault condition. For instance, a power switch may be located on a PDU to which one or more servers are electrically connected and which is configured to appropriately distribute power to the servers.

SUMMARY

The increased demand for computing resources such as processing capacity, data storage and the like has led to the increased usage of the interior space of storage racks such as by FRUs, cabling, and the like. Furthermore, as many end users have a fixed or dedicated amount of floor space on which to position storage racks, replacing existing storage racks with larger storage racks to increase the volume of the interior space is often not feasible.

One problem accompanying the increased usage of the interior space of storage racks by FRUs, cabling, and the like is a decrease in the space through which an operator can extend his or her hand to manipulate power switches in the rack (e.g., to flip switches into an on or off position). For instance, the PDUs to which servers and other computing devices are electrically connected when mounted in a storage rack are often located behind the bays of the servers in the rack or in other words in the space between the rear pillars and the rear opening or rear door of the storage rack. To access the power switches on the PDUs (or other switches on the rear portions of the servers/computing devices), a user must insert his or her hand into or through the space between the rear pillars and the rear opening to manipulate the power switches.

However, the increased demand for computing resources and corresponding increased usage of the "real estate" inside of storage racks has led to increased usage of the space between the rear pillars and the rear opening, the same space through which a user's hand would typically be inserted to manipulate the power switches. In addition to creating difficulties in reaching or accessing the power switches, the above-noted increased real estate usage often makes it difficult for a user to even see the power switches, much less physically reach the power switches.

In this regard, disclosed herein are various embodiments of a power switch manipulation apparatus that allows users to manipulate power switches of FRUs mounted within storage racks in a manner free of a user having to physically reach into the storage rack to manipulate the power switches. One embodiment of the disclosed manipulation apparatus broadly includes a base member that may be rigidly secured to a portion of the frame of a storage rack (e.g., on a side or vertical member adjacent a rear door or opening of the rack at the same or similar height as at least one of the power switches) along with a tool that is movably mounted or mountable to the base member for manipulating a power switch of a FRU mounted in the rack. More specifically, the tool has a reduced form factor in one or both of the x-dimension (e.g., horizontal direction along rear door/opening of rack) and the z-dimension (e.g., vertical dimension) to allow it to fit through tight spaces between the rear of the rear and a particular one of the power switches. Furthermore, the base member includes one or more features that are specifically configured to guide a manipulation end or portion of the tool (e.g., upon manipulation of a handle or other portion of the tool protruding out of the rack by a user) to be directly in front of a power switch so that the user can use the handle or other portion of the tool to manipulate the power switch (e.g., into an on or off position) with the manipulation portion of the handle.

For instance, the base member may include a guide channel having a longitudinal axis about which the tool is configured to rotate in clockwise and counterclockwise directions and along which the tool is configured to translate (e.g., slide) in first and second opposite directions to guide use of the tool for manipulation of a power switch. As another example, the tool and base member may have respective features that appropriately inhibit translation or rotation of the tool along or about the longitudinal axis to facilitate positioning of the manipulation portion of the tool in front of the power switch. For instance, the tool may include an alignment pin or protrusion that is configured to inhibit further translation of the tool within the guide member along the longitudinal axis after the manipulation portion of the tool has translated to a depth (e.g., in a y-dimension) in the rack substantially equal to that of a power switch of a particular FRU. Also, the base member may include a stop member that is configured to automatically inhibit rotation of the tool about the longitudinal axis when it has reached a rotational position that is in front of the switch; thereafter, the tool may be urged along the longitudinal axis to manipulate the switch.

In one aspect, a system for manipulating a power switch of an electronic device is disclosed that includes a base member that is non-movably attachable relative to a power switch of an electronic device and a manipulation member movably mountable to the base member for manipulating the power switch of the electronic device. The manipulation member includes a first arm receivable in a guide channel of the base member, where the first arm is slidable within the guide channel along a longitudinal axis of the first arm, and where the first arm is rotatable within the guide channel about the longitudinal axis of the first arm. The manipulation member also includes a second arm non-movable relative to the first arm and configured to contact the power switch, where sliding of the first arm within the guide channel along the longitudinal axis with the second arm in a first rotational position induces the second arm to contact and manipulate the power switch into a first position, where rotation of the first arm within the guide channel about the longitudinal axis of the first arm in one of a clockwise or counterclockwise direction rotates the second arm into a second rotational position, and where sliding of the first arm within the guide channel along the longitudinal axis of the first arm with the second arm in the second rotational position induces the second arm to contact and manipulate the power switch into a second position.

In one arrangement, the first arm may include an alignment mechanism (e.g., a pin or other protrusion that extends from the body of the first arm) that contacts the base member as the first arm slides in the guide member along the longitudinal axis of the first arm to inhibit further sliding of the first arm in the guide member along the longitudinal axis of the first arm absent the first arm being rotated within the guide channel about the longitudinal axis of the first arm to position the second arm in the first rotational position. In another arrangement, the base member may include a stop member that inhibits further rotation of the first and second arms in the one of the clockwise or counterclockwise direction after the second arm has reached the second rotational position. For instance, the base member may include first and second legs that are non-movably attached to each other, where the guide channel is non-movably attached to the first leg, and wherein the stop member is non-movably attached to the second leg.

In another aspect, a storage rack for storing a plurality of electronic devices is disclosed that includes a frame defining an interior space for receiving a plurality of electronic devices and an apparatus secured to the frame for manipulating a power switch of at least one of the plurality of electronic devices. The apparatus includes a base member rigidly secured to the frame and having a guide channel that extends along a longitudinal axis along with a tool receivable in the guide channel of the base member for rotation about and translation along the longitudinal axis of the guide channel. Translation of the tool within the guide channel along the longitudinal axis of the guide channel with a manipulation portion of the tool in a first rotational position induces the manipulation portion to contact and manipulate the power switch into a first position, rotation of the tool within the guide channel about the longitudinal axis of the guide channel in one of a clockwise or counterclockwise direction rotates the manipulation portion into a second rotational position, and translation of the tool within the guide channel along the longitudinal axis of the guide channel with the manipulation portion in the second rotational position induces the manipulation portion to contact and manipulate the power switch into a second position.

In a further aspect, a method of manipulating a power switch of an electronic device mounted in a storage rack includes inserting a tool into the storage rack, positioning the tool into a guide channel of a base member that is fixed to a vertical member of the storage rack, rotating the tool about a longitudinal axis of the guide channel in one of a clockwise or counterclockwise direction to rotate a manipulation portion of the tool into a rotational position in front of the power switch of the electronic device, and urging the tool along the longitudinal axis of the guide channel in a first direction with the manipulation portion in the rotational position to contact the power switch with the manipulation portion a manipulate the power switch into one of an on or off position.

Before the rotating, the method may include urging the tool along the longitudinal axis of the guide channel in the first direction until an alignment member of the tool contacts the base member to inhibit further urging of the tool along the longitudinal axis in the first direction absent the rotating. After the pushing, the method may include rotating the tool about the longitudinal axis of the guide channel in the one of a clockwise or counterclockwise direction to rotate the manipulation portion of the tool into another rotational position in front of the power switch of the electronic device, and urging the tool along the longitudinal axis of the guide channel in the first direction with the manipulation portion in the other rotational position to contact the power switch with the manipulation portion a manipulate the power switch into the other of the on or off position.

In another aspect, a system for manipulating a power switch of an electronic device is disclosed. The system includes a base member that is non-movably attachable relative to a power switch of an electronic device and a mechanical linkage movably mountable to the base member for manipulating the power switch of the electronic device. The mechanical linkage includes a first mechanical link pivotally attached to the base member to pivot about a pivot axis and a second mechanical link that is induced by the first mechanical link upon movement of the first mechanical link from a first position to a second position to manipulate a power switch (e.g., to turn it on or off) and/or induced by the power switch to manipulate the first mechanical link back into the first position (e.g., upon tripping of the power switch to provide a visual indication to a user of the tripped condition).

In one arrangement, the second mechanical link may be in the form of a rocker assembly that is pivotally attached to the base member to pivot about a pivot axis that is parallel to and spaced from the pivot axis of the first mechanical link. For instance, pivoting of the first mechanical link from the first to the second position in one of clockwise or counterclockwise direction induces the rocker arm to pivot in the other of the clockwise or counterclockwise direction to cause a first rocker leg of the rocker assembly to depress an on button of the power switch. Thereafter, popping out of the on button upon tripping of the power switch presses against the first rocker leg to induce rotation of the rocker leg in the one of the clockwise or counterclockwise direction and simultaneous rotation of the first mechanical link in the other of the clockwise or counterclockwise direction to move the first mechanical link into the first position to provide the visual indication of the tripped position.

In another arrangement, the second mechanical link may be in the form of a sliding member that is slidably (translatably) attached to the base member and pivotally attached to the first mechanical link. For instance, pivoting of the first mechanical link from the first to the second position in one of clockwise or counterclockwise direction induces the sliding member to slide in a first of first and second opposite linear directions to depress an on button of the power switch. Thereafter, popping out of the on button upon tripping of the power switch presses against the sliding member to induce sliding of the sliding member in the opposite second linear direction to induce rotation of the first mechanical link in the other of the clockwise or counterclockwise direction to move the first mechanical link into the first position to provide the visual indication of the tripped position.

In a further aspect, a system for manipulating a power switch of an electronic device includes a base member that is non-movably attachable relative to a power switch of an electronic device, and a manipulation assembly movably mountable to the base member for manipulating the power switch of the electronic device. The manipulation assembly includes a first tool slidably attached to the base member for movement relative to the base member along a first axis in a first direction towards the power switch to manipulate the power switch into an on position and along the first axis in an opposite second direction away from the power switch when manipulated by the power switch, and a second tool slidably attached to the base member for movement relative to the base member along a second axis to manipulate the power switch into an off position.

The first tool may be biased with a first biasing force in along the first axis in the first direction towards the power switch (e.g., via a first biasing member interconnected between the first arm and the base member). For instance, the base member may include a first connection surface (e.g., protrusion) that extends along the first axis in the first direction, where the first tool includes a connection surface that extends along the first axis in the second direction, and where the first biasing member is connected between the first connection surface of the base member and the connection surface of the first tool.

The second tool may also be biased with a second biasing force along the second axis in the second direction away from the power switch (e.g., via a second biasing member interconnected between the second arm and the base member). For instance, the base member may include a second connection surface that extends along the second axis in the second direction, where the second tool includes a connection surface that extends along the second axis in the first direction, and where the second biasing member is connected between the second connection surface of the base member and the connection surface of the second tool.

In another aspect, a method of manipulating a power switch of an electronic device mounted in a storage rack includes urging a first tool along a first axis in a first direction from a first position of the first tool into a second position of the first tool to manipulate a first portion of the power switch into an on position of the power switch, where a first end of the first tool is a first distance from a vertical reference plane that is perpendicular to the first axis in the first position, where the first end of the first tool is a second distance from the vertical reference plane in the second position that is less than the first distance, where a first end of a second tool that is slidable along a second axis that is parallel to the first axis is a first distance from the vertical reference plane when the first tool is in the second position, and where the first distance of the first end of the second tool is equal to the second distance of the first end of the first tool.

In one arrangement, the method may further include receiving, on the first tool, a force from the first portion of the power switch that urges the first tool along the first axis in a second direction that is opposite to the first direction. In another arrangement, the method may further include generating the force upon tripping of the power switch.

In a further aspect, a storage rack includes a frame defining an interior space for receiving a plurality of computing devices, and a system secured to the frame for manipulating a power switch of an electronic device of the storage rack. The system includes a base member rigidly attached to the frame and being non-movable relative to a power switch of an electronic device, a first tool slidably attached to the base member for movement relative to the base member along a first axis in a first direction towards the power switch to manipulate the power switch into an on position and along the first axis in an opposite second direction away from the power switch when manipulated by the power switch, and a second tool slidably attached to the base member for movement relative to the base member along a second axis to manipulate the power switch into an off position.

Any of the embodiments, arrangements, or the like discussed herein may be used (either alone or in combination with other embodiments, arrangement, or the like) with any of the disclosed aspects. Merely introducing a feature in accordance with commonly accepted antecedent basis practice does not limit the corresponding feature to the singular. Any failure to use phrases such as "at least one" does not limit the corresponding feature to the singular. Use of the phrase "at least generally," "at least partially," "substantially" or the like in relation to a particular feature encompasses the corresponding characteristic and insubstantial variations thereof. Furthermore, a reference of a feature in conjunction with the phrase "in one embodiment" does not limit the use of the feature to a single embodiment.

In addition to the exemplary aspects and embodiments described above, further aspects and embodiments will become apparent by reference to the drawings and by study of the following descriptions.

BRIEF DESCRIPTION OF THE DRAWINGS

FIG. 1 is a partial front perspective view of one embodiment of a storage rack for use in storing electronic devices such as FRUs (e.g., servers, data storage devices, etc.), PDUs, and the like.

FIG. 6 is an exploded perspective view of the power switch manipulation apparatus of FIG. 5.

FIG. 7b is a plan view of FIG. 7a.

FIG. 8b is a plan view of FIG. 8a.

FIG. 9a is a front view of the power switch manipulation apparatus of FIG. 5 illustrating the tool being received in the guide channel of the base member and being rotated in one of a clockwise or counterclockwise direction about a longitudinal axis of the guide channel from the position shown in FIG. 8a.

FIG. 9b is a plan view of FIG. 9a.

FIG. 11a is a FIG. 9a is a front view of the power switch manipulation apparatus of FIG. 5 illustrating the tool being received in the guide channel of the base member and being further rotated in the one of the clockwise or counterclockwise direction about the longitudinal axis of the guide channel from the position shown in FIG. 9a.

FIG. 11b is a perspective view of the power switch manipulation apparatus with the tool in the position of FIG. 11a.

FIG. 12b is a rear isometric view of the holder of FIG. 12a.

DETAILED DESCRIPTION

Disclosed herein are various embodiments of a power switch manipulation apparatus 200 that allows users to manipulate power switches of FRUs mounted within storage racks in a manner free of a user having to physically reach into the storage rack to manipulate the power switches. The disclosed power switch manipulation apparatus is useful in crowded storage racks where space is at a premium and/or where users may otherwise have difficulty with physically reaching into the storage rack to flip a power switch of a FRU on or off. One embodiment of the disclosed manipulation apparatus broadly includes a base member that may be rigidly secured to a portion of the frame of a storage rack (e.g., on a side or vertical member adjacent a rear door or opening of the rack at the same or similar height as at least one of the power switches) along with a tool that is movably mounted or mountable to the base member for manipulating a power switch of a FRU mounted in the rack. The tool may have a reduced form factor in one or both of the x-dimension (e.g., horizontal direction along rear door/opening of rack) and the z-dimension (e.g., vertical dimension) to allow it to fit through tight spaces between the rear of the rear and a particular one of the power switches. Furthermore, the base member includes one or more features that are specifically configured to guide a manipulation end or portion of the tool (e.g., upon manipulation of a handle or other portion of the tool protruding out of the rack by a user) to be directly in front of a power switch so that the user can use the handle or other portion of the tool to manipulate the power switch (e.g., into an on or off position) with the manipulation portion of the handle.

Figure 1:
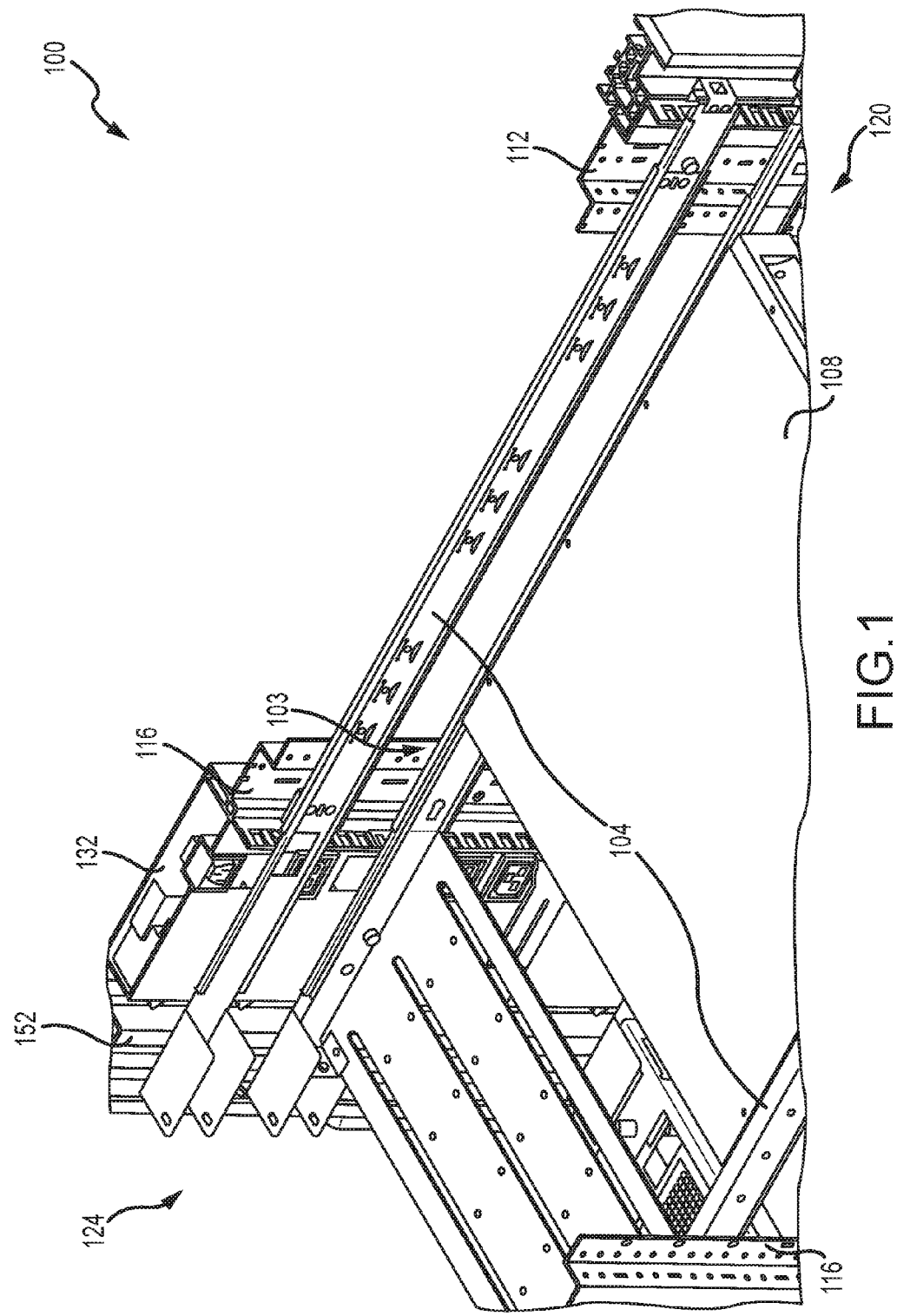
Figure 2:
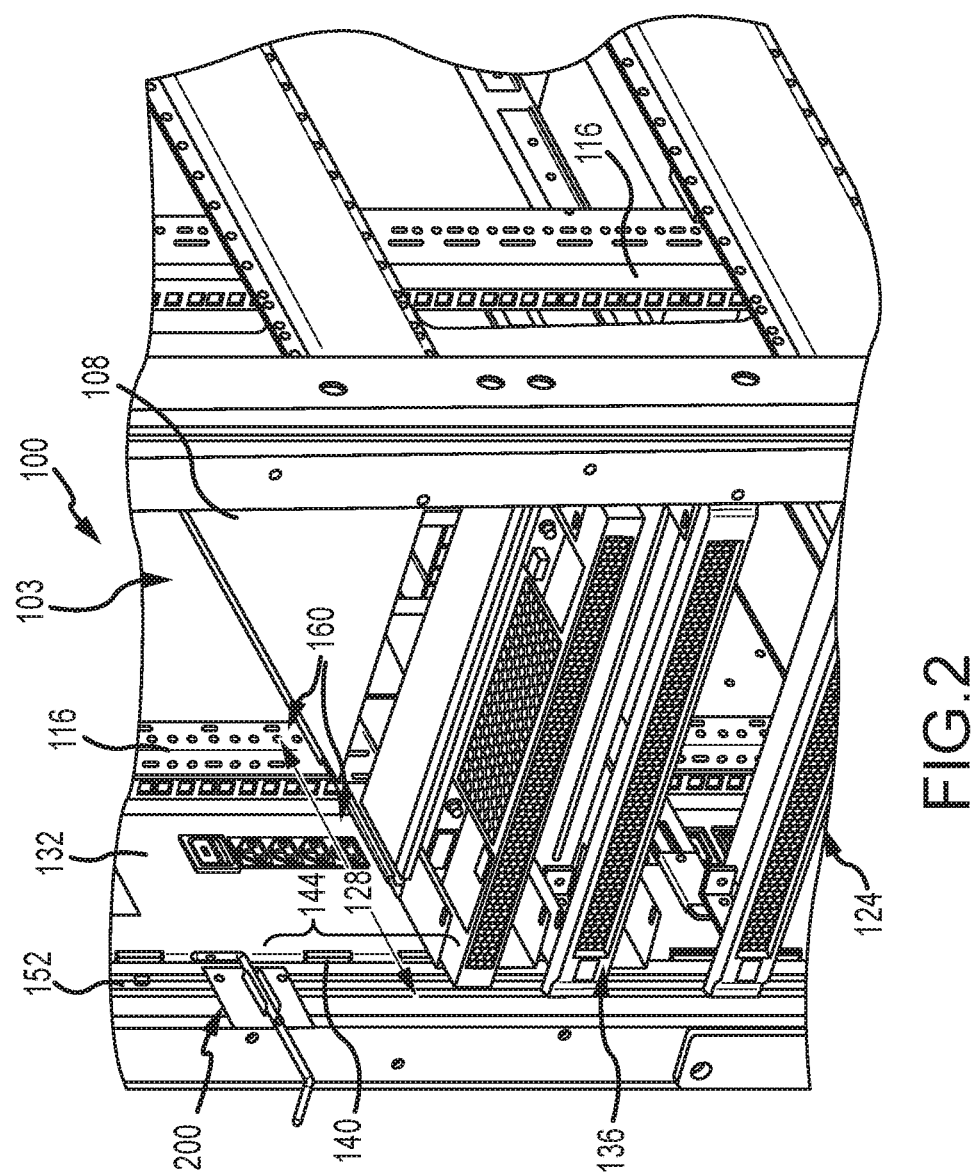
FIG. 2 is a partial rear perspective view of the storage rack of FIG. 1.

Before discussing the power switch manipulation apparatus 200 in more detail, reference will be initially made to the storage rack 100 of FIGS. 1-2 to provide an example of one representative environment in which the manipulation apparatus 200 may be implemented. It is to be understood though that the disclosed manipulation apparatus 200 may be implemented in various other shapes, configurations and sizes of storage racks for electronic devices and/or FRUs, all of which are encompassed herein. Broadly, the storage rack 100 is operable to store one or more FRUs 108 (e.g., electronic devices such as servers, data storage devices, media element players, etc.) in one or more respective bays (not labeled) of the storage rack 100, such as in a vertically stacked manner (as shown), in a horizontally stacked manner, and/or the like. The storage rack 100 may include a pair of front vertical posts or pillars 112 and a pair of rear vertical posts or pillars 116 that extend upward from a floor or other platform (not shown) and that collectively define a frame of the storage rack 100 and form an interior storage space 103 in which the bays of the storage rack 100 are disposed for receiving respective FRUs 108. Each of the front and rear vertical pillars 112, 116 may be operable to receive and/or engage with a plurality of rail assemblies 104 that define the bays for structurally supporting the FRUs 108. Generally, each pair of rail assemblies 104 is configured to receive and guide a FRU 108 into the rack such that when fully loaded, a rear portion of the FRU 108 is adjacent or proximate the rear pillars 116 and the front portion of the FRU 108 is adjacent or proximate the front pillars 112.

Although not necessarily labeled, the frame of the storage rack 100 may be further defined by any appropriate arrangement of horizontal members interconnecting the front and/or pillars 112, 116; paneling or wall members secured to the front and rear pillars 112, 116, horizontal members, etc.; other vertical members; and the like. The storage rack 100 may also include a front access opening 120 through which the FRUs 108 may be retracted and reinserted, and a rear access opening 124 through which necessary connections may be made to the FRUs 108 (e.g., for coupling the FRUs 108 to external components or to each other, etc.). Access doors (not shown) may be provided over the front and rear access openings 120, 124 to limit immediate access to the interior of the storage rack 100. Grills or other perforations may be included in any appropriate portion of the storage rack 100 to enhance airflow therethrough and the various components of the storage rack 100 may be formed of metal, plastic, composites, and/or the like.

In some arrangements, the rear pillars 116 may be set back from the rear access opening 124 of the rack 100 such that a space 128 is defined between the rear pillars 116 and the rear access opening 124 for the passage of cabling, the storage of FRUs, etc. (collectively, componentry 136). In one arrangement, and while not limiting, the space 128 may be occupied by componentry 136 of a virtual backplane (e.g., including blind-mate connectors, power and network cabling, etc.) that is configured to incorporate the enhanced availability and serviceability of a blade or chassis-based computing system into the storage rack 100. For instance, such componentry may include that discussed in U.S. Patent App. Pub. No. 2014/0240909 assigned to the Assignee of the present application and the entirety of which is incorporated herein by reference as if set forth in full.

However, the increasing usage of the space 128 between the rear pillars 116 and the rear access opening 124 of storage racks such as storage rack 100 can limit the ability of users to physically access or even see power switches within the storage rack 100 that users would otherwise physically access via the rear access opening 124 (e.g., such as power switch 140 of PDU 132). In the absence of componentry being disposed in the space 128 adjacent a particular power switch 140, a gap 144 exists in the space 128 between the rear pillars 116 and the rear access opening 124 of the storage rack 100 that provides sufficient room for a user to physically reach into the space 128 and access the power switch 140 of the PDU 132 (e.g., or switches on the back of FRUs 108, etc.).

Figure 3:
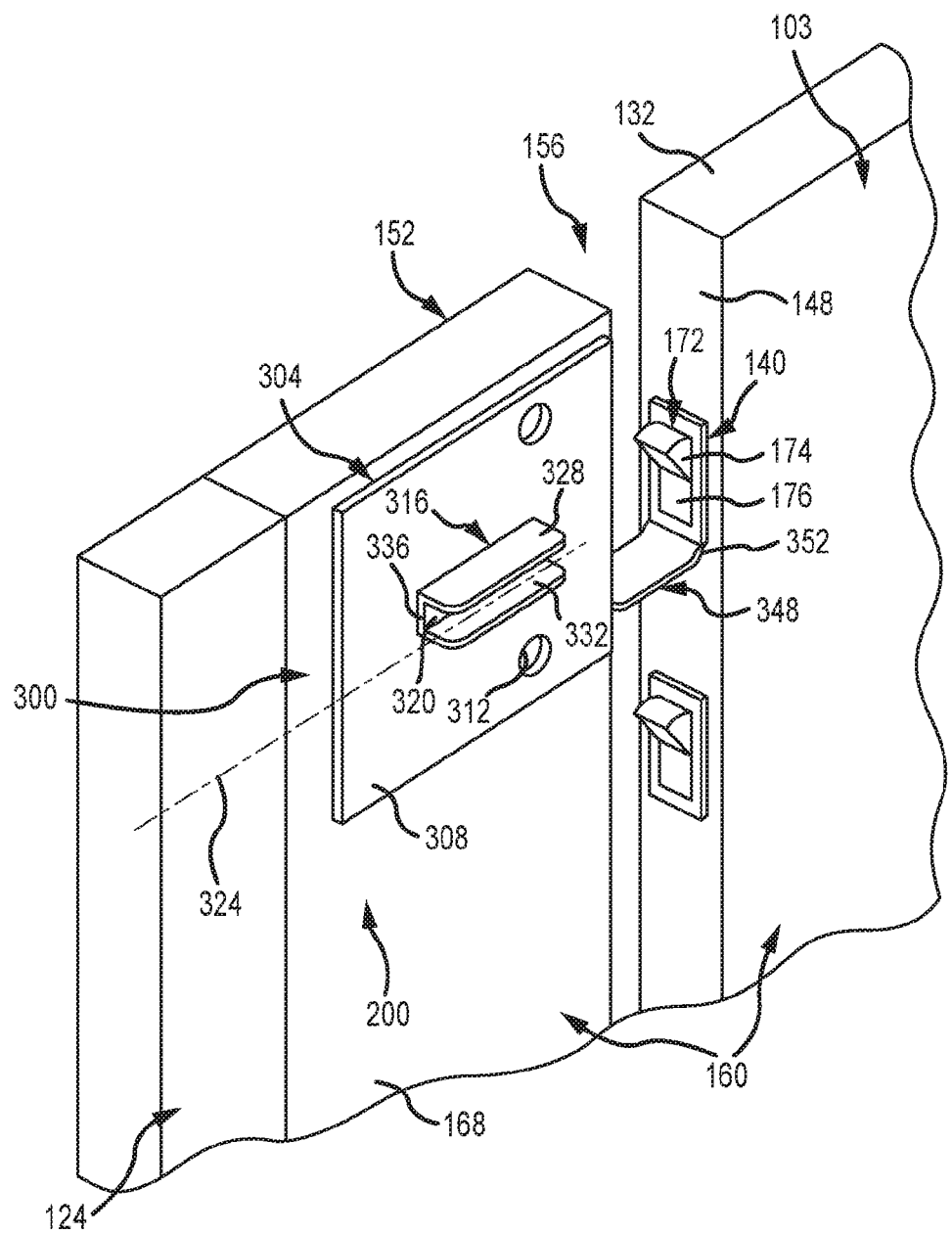
FIG. 3 is close-up rear perspective view of the storage rack of FIG. 1 illustrating power switches of a PDU being disposed in a side vertical slot of the rack and a base member of a power switch manipulation apparatus being mounted to the rack for use in manipulating the power switches (with a rotation stop member of the base member being removed for clarity).
Figure 4:
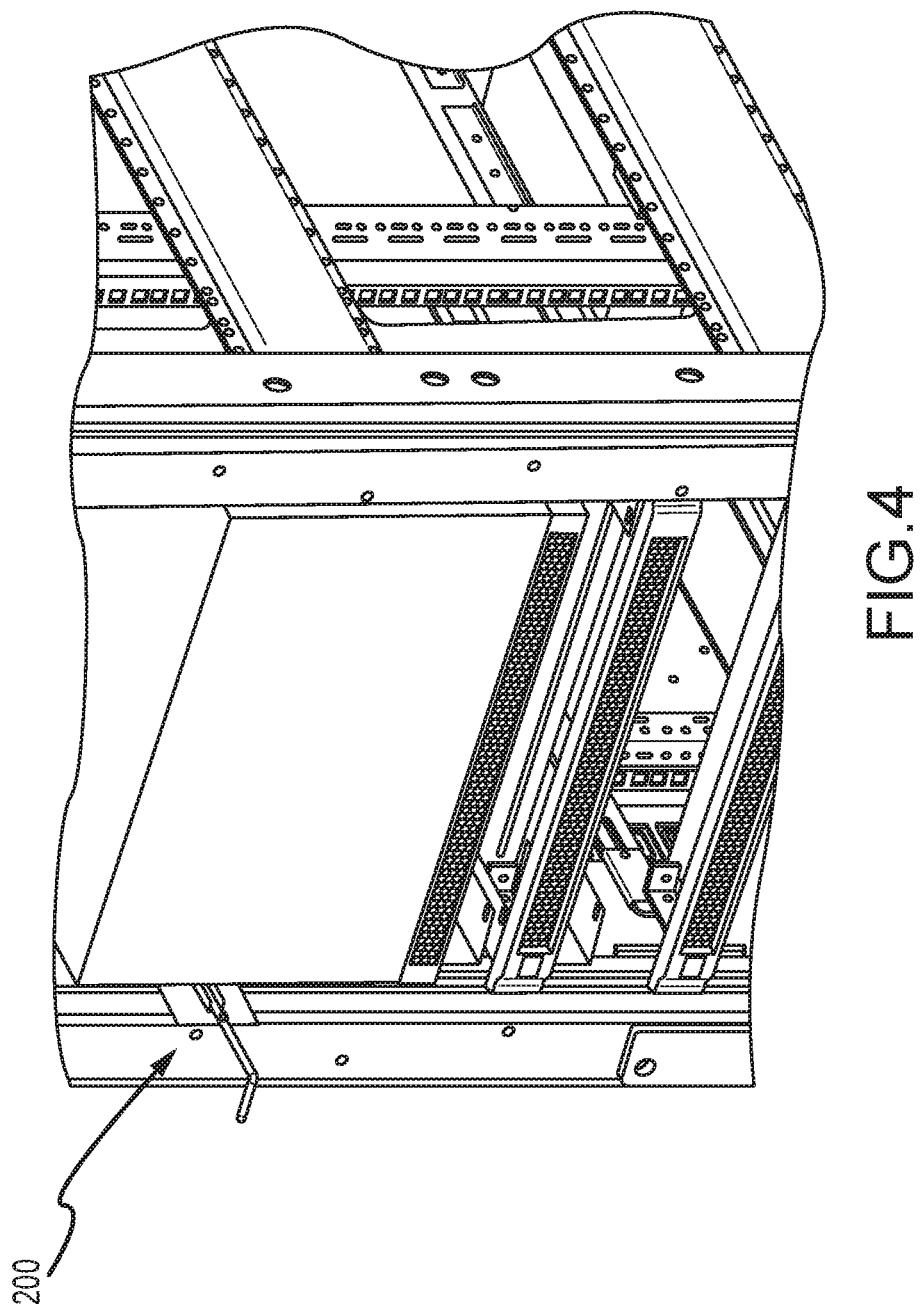
FIG. 4 is a partial rear perspective view of the storage rack of FIG. 1 similar to that of FIG. 2 but with additional componentry being disposed in a space between a rear opening of the rack and rear support pillars thus limiting physical access to power switches of a PDU of the rack.

As shown in FIG. 3, the power switches 140 of the PDU 132 may protrude from a side surface 148 of the PDU 128 that faces a side surface 164 (labeled in FIG. 5) of a vertical support member 152 of the storage rack 100 such that the power switches 140 are disposed in a vertical slot 156 defined between the side surface 148 and the vertical member 152. Stated differently, the power switches 140 may be disposed on or protrude from a surface (e.g., such as side surface 148 of the PDU 132) that is substantially perpendicular to an inside side surface 160 of the storage rack 100 (e.g., such as a surface of rear pillar 116 that faces FRUs 108 loaded in the storage rack 100) and that is offset from the interior storage space 103 of the storage rack 100. In this regard, a user would reach into or through the space 128 and then approximately 90 degrees to the left (as shown) or right into the vertical slot 156 to access power switches 140.

When the gap 144 has been filled with componentry 136 (e.g., brackets, cabling, etc.), however, the user may be limited or even prevented from physically reaching into the space 128 to access the power switches 140. Compare FIGS. 2 and 4, where componentry 136 is represented by a generic box in FIG. 4. With reference now to FIGS. 2-6, the power switch manipulation apparatus 200 allows users to manipulate switches within the storage rack 100, such as one or more of the power switches 140 of the PDU 132, free of having to physically reach into the storage rack 100 (e.g., into or through space 128 via rear opening 124) to manipulate the power switches 140. That is, despite an opening or passageway to a power switch 140 through which a user can reach his or her hand and arm not being available (e.g., due to componentry 136 blocking such an opening or passageway), the manipulation apparatus 200 nevertheless affords the user the ability to manipulate one or more of the power switches 140 and/or other switches in the rack 100.

Broadly, the manipulation apparatus 200 includes a base member 300 that may be rigidly or otherwise non-movably secured to a portion of the frame of the storage rack 100 along with a tool 400 (e.g., a manipulation member or assembly) that is movably mounted or mountable to the base member 300 for manipulating one or more switches of an FRU mounted in the storage rack 100, such as power switches 140 of PDUs 132. As shown, the base member 300 may include a body 304 (e.g., one or more brackets or the like) that may be rigidly secured to the frame in any appropriate manner (e.g., via fasteners, welds, etc.). For instance, the body 304 may include at least a first leg 308 (e.g., a sheet member, a bracket, etc.) that may be rigidly secured to the vertical member 152, such as via extending fasteners (not shown) through apertures 312 in the first leg 308 and into a front surface 168 of the vertical member 152 (e.g., where the front surface 168 generally forms a portion of the inside side surface 160 of the rack 100).

The base member 300 may also include a guiding member 316 (e.g., bracket, clip, etc.) secured or otherwise formed on the body 304 and that defines a guiding channel 320 having a longitudinal axis 324 about which the tool 400 is configured to rotate in clockwise and counterclockwise directions and along which the tool 400 is configured to translate (e.g., slide) in first and second opposite directions as will be discussed in more detail below. In one arrangement, the guiding member 316 may include first and second spaced members 328, 332 that are interconnected by a third member 336 and that define the guide channel 320 therebetween. For instance, each of the first, second and third members 328, 332, 336 may be in the form of a sheet member and the guiding member 316 may be secured to the first leg 308 of the body 304 by extending fasteners through apertures (not shown) in the third member 336 and into corresponding apertures 340 in the first leg 308 so that the first and second legs 328, 332 protrude or otherwise extend away from the first leg 308 towards the space 128 in the rack 100.

Figure 22:
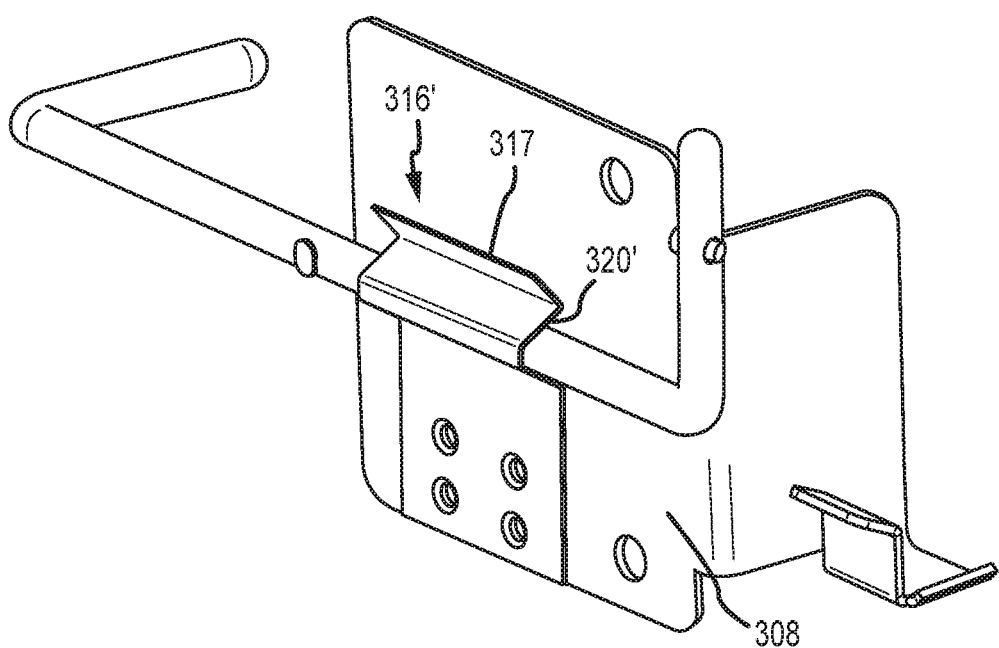
FIG. 22 is a perspective view of another embodiment of the power switch manipulation apparatus.
Figure 23:
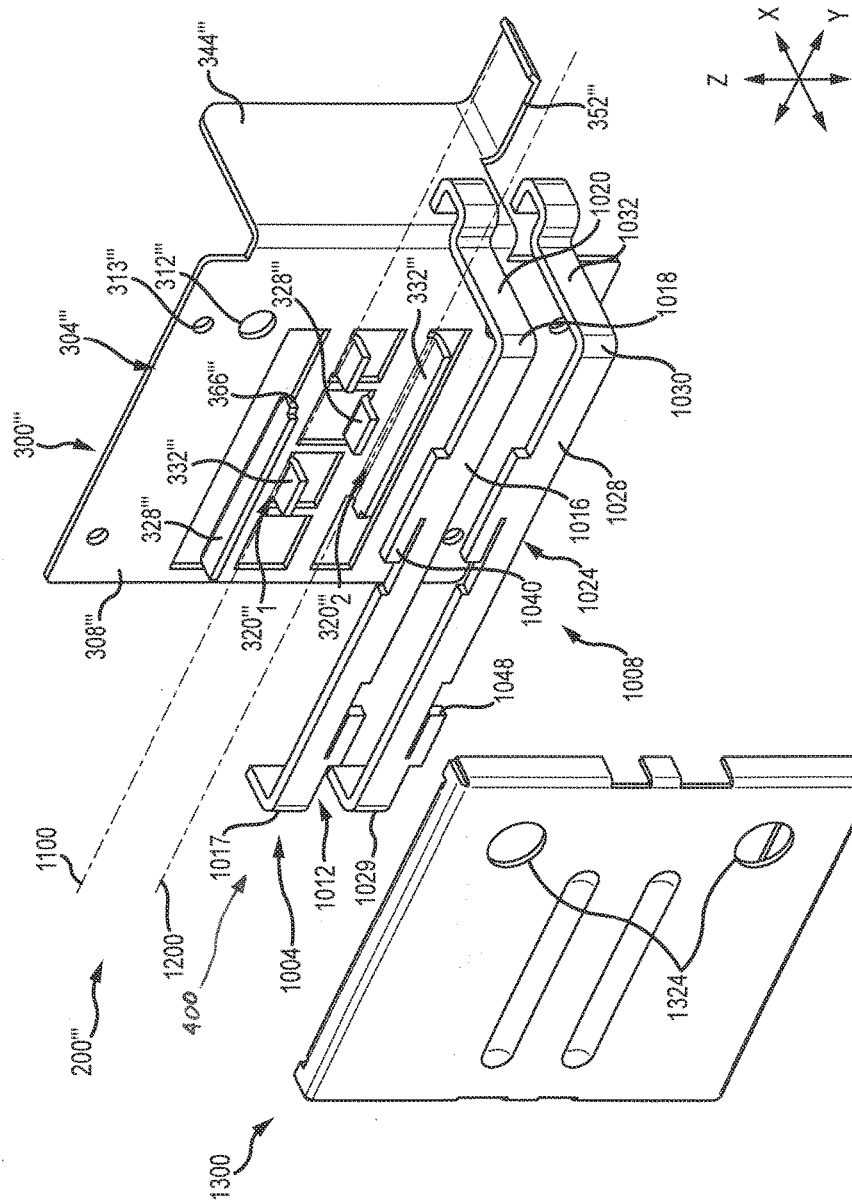
FIG. 23 is an exploded perspective view of another embodiment of the power switch manipulation apparatus.
Figure 24:
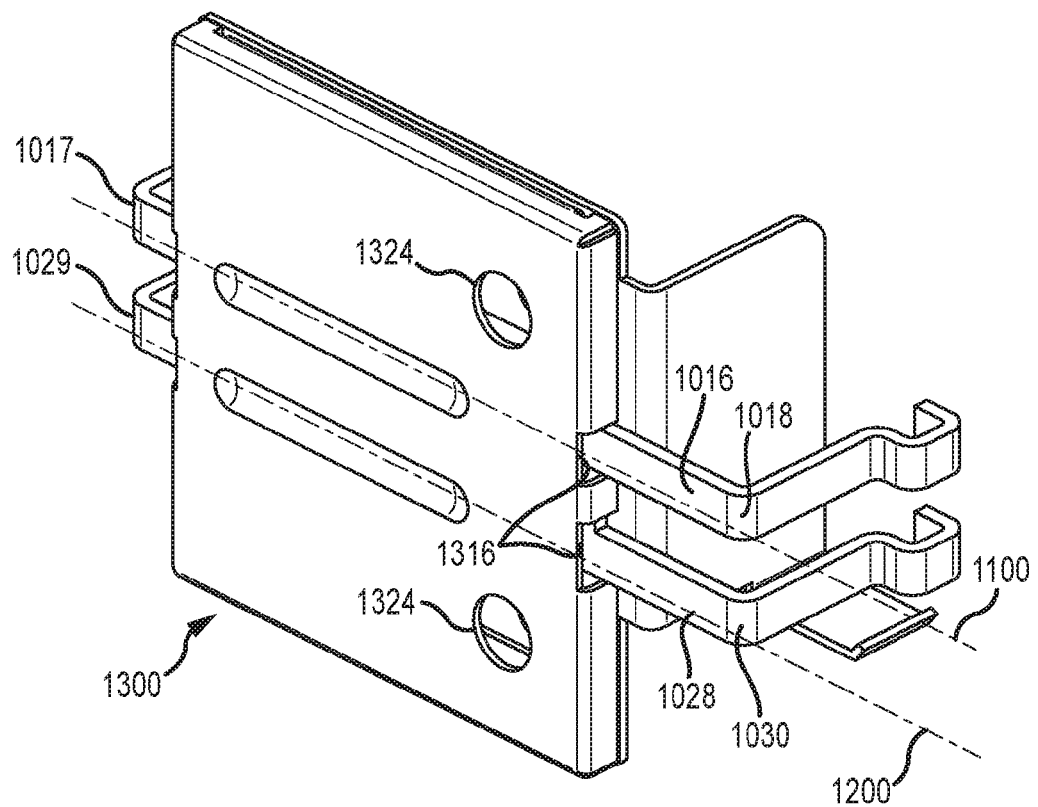
FIG. 24 is a front perspective view of the power switch manipulation apparatus of FIG. 23.
Figure 25:
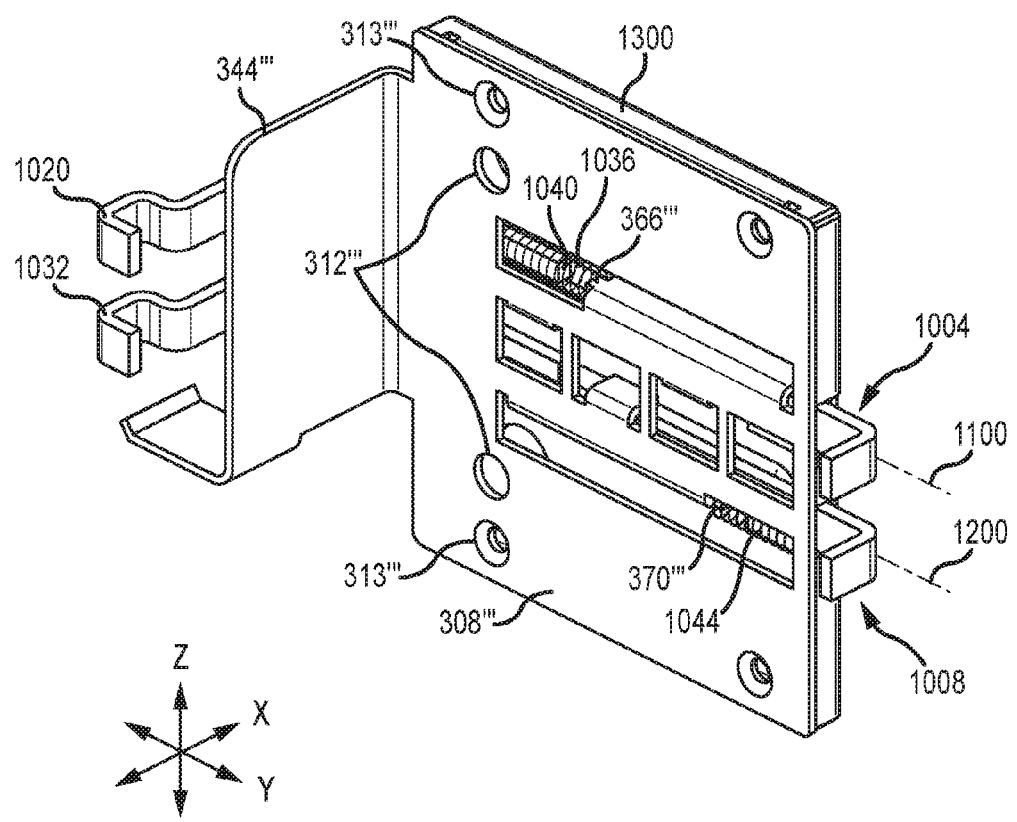
FIG. 25 is a rear perspective view of the power switch manipulation apparatus of FIG. 23.
Figure 26:
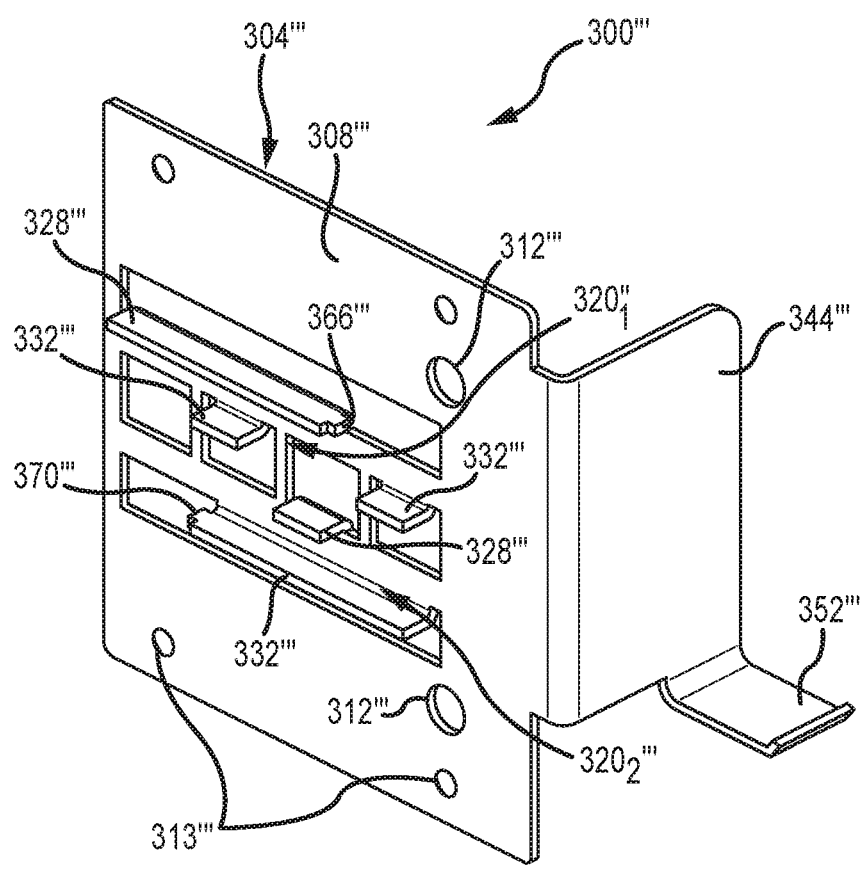
FIG. 26 is a front perspective view of a base member of the power switch manipulation apparatus of FIG. 23.
Figure 27:
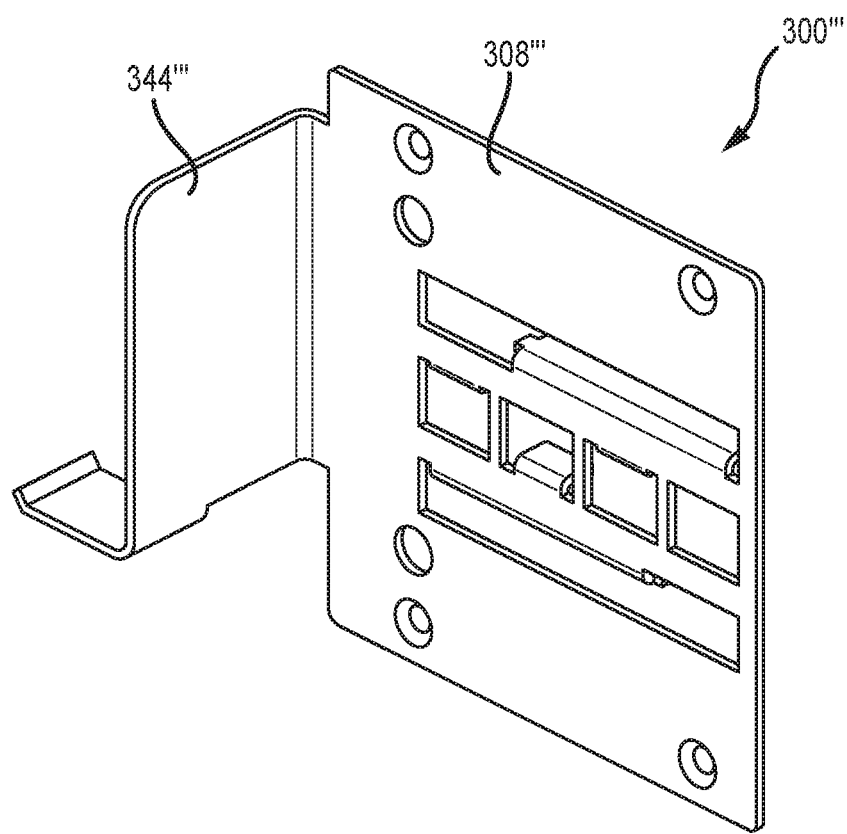
FIG. 27 is a rear perspective view of the base member of the power switch manipulation apparatus of FIG. 23.
Figure 28:
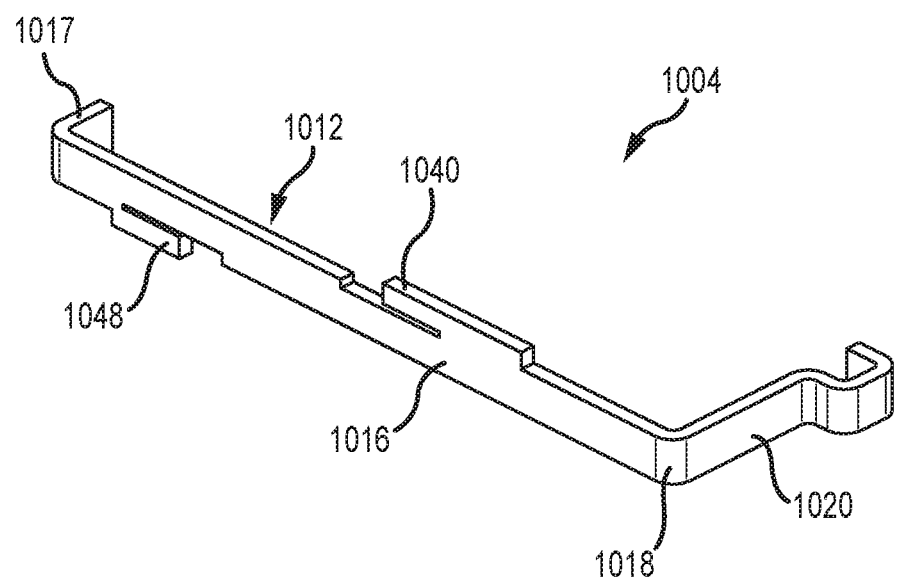
FIG. 28 is a front perspective view of a tool of the power switch manipulation apparatus of FIG. 23.
Figure 29:
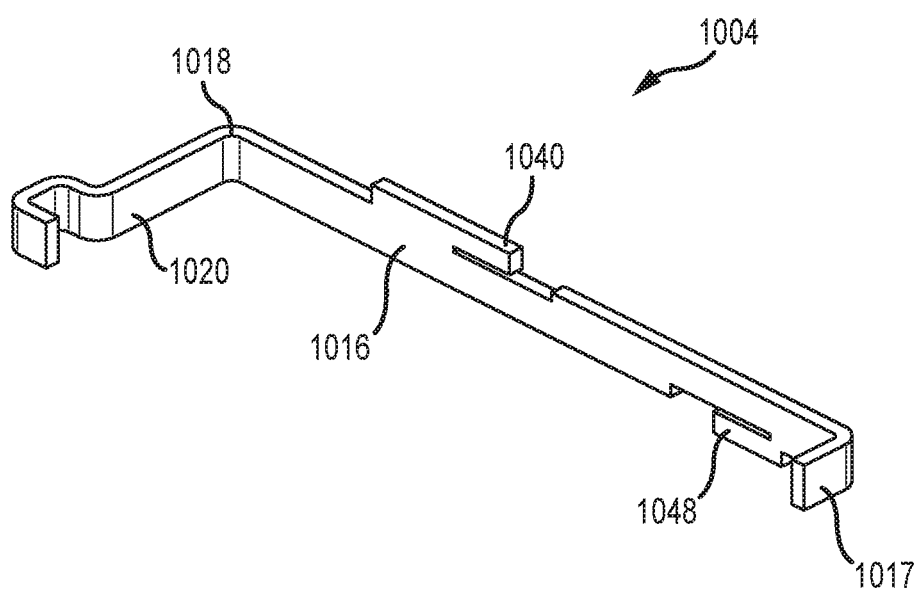
FIG. 29 is a rear perspective view of the tool of the power switch manipulation apparatus of FIG. 23.
Figure 30:
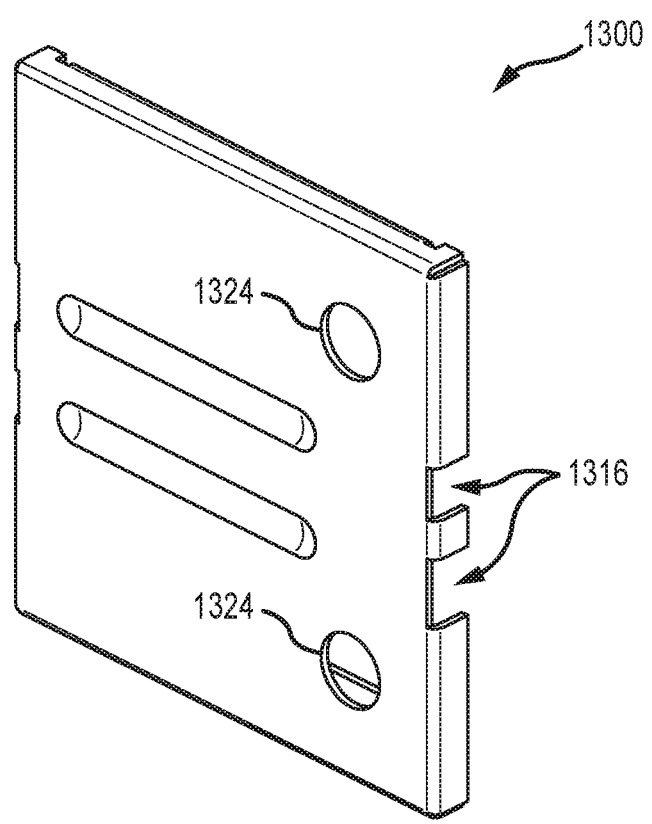
FIG. 30 is a front perspective view of a cover member of the power switch manipulation apparatus of FIG. 23.
Figure 31:
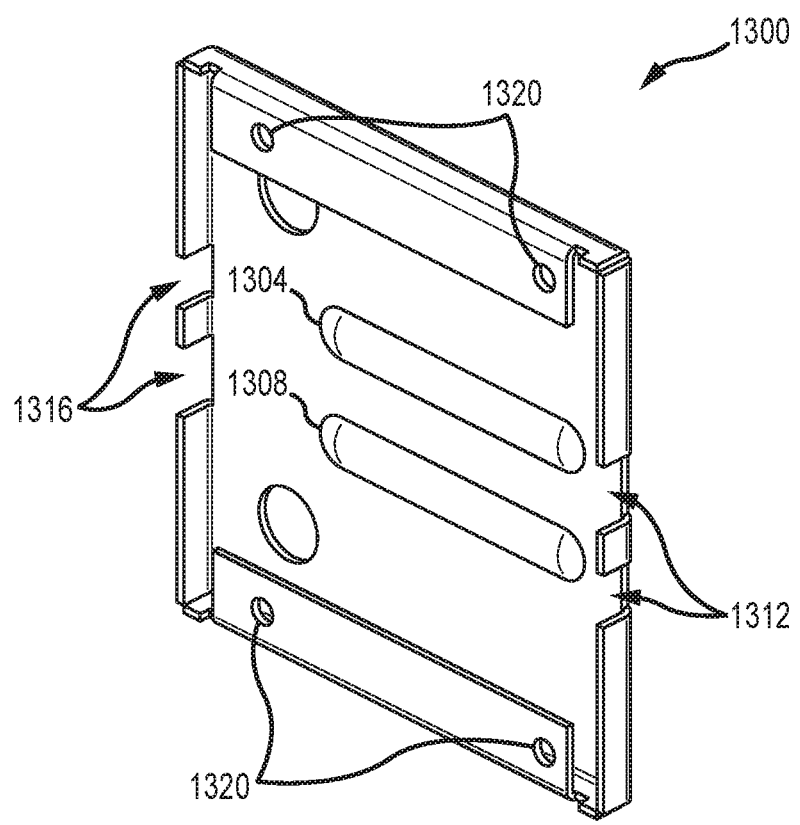
FIG. 31 is a rear perspective view of the cover member of the power switch manipulation apparatus of FIG. 23.

In one embodiment, a distance between the first and second members 328, 332 may be substantially equal to or slightly less than an outer diameter or outer maximum dimension of a portion of the tool 400 being received in the guide channel 320 so that the guiding member 316 can retain the tool 400 when inserted therein. In another embodiment, the first and second legs 328, 332 may slightly taper towards one another in a direction away from the first leg to apply a slight force against the tool 400 when received in the guide channel 320. Various other arrangements of guiding members 316 that define corresponding guide channels 320 that allow for rotation and translation of a tool received therein for manipulation of a switch are envisioned and encompassed herein. As an example, FIG. 22 presents another embodiment in which the guiding member 316' is in the form of a spring-loaded member that defines the guide channel 320' and that is configured to hold the tool 400 against the first leg 308 of the body 304 (but still allows for rotation and translation of the tool 400 in the guide channel 320'). For instance, the tool 400 may be slid downwardly between the first leg 308 and an angled tab 317 of the guiding member 316' to force the tool 400 into the guide channel 320' against the spring force of the guiding member 316'. Once the tool 400 has entered the guide channel 320', the guiding member 316' may be configured to snap back against the first leg 308 to hold the tool 400 thereagainst.

Returning to FIGS. 5-6, the body 304 of the base member 300 may further include a second leg 344 rigidly (e.g., non-movably) attached or secured to the first leg 308 and configured to be inserted into the vertical slot 156 to facilitate location of the base member 300 adjacent a particular one of the power switches 140, to facilitate positioning of a manipulation portion of the tool 400 in front of the power switch 140, and/or the like. For instance, the first and second legs 308, 344 may be substantially perpendicular to each other to allow the first leg 308 to be mounted to the front surface 168 of the vertical member and have the second leg 344 automatically "reach into" the vertical slot 156 to facilitate positioning of the manipulation portion of the tool 400 in front of the power switch 140. In one arrangement, the second leg 344 may be in the form of or include a sheet member that is configured to lay flush or closely flush (e.g., parallel) with the side surface 164 of the vertical member 152. For instance, the first and second legs 308, 344 may lie in respective planes that are perpendicular to each other.

Figure 5:
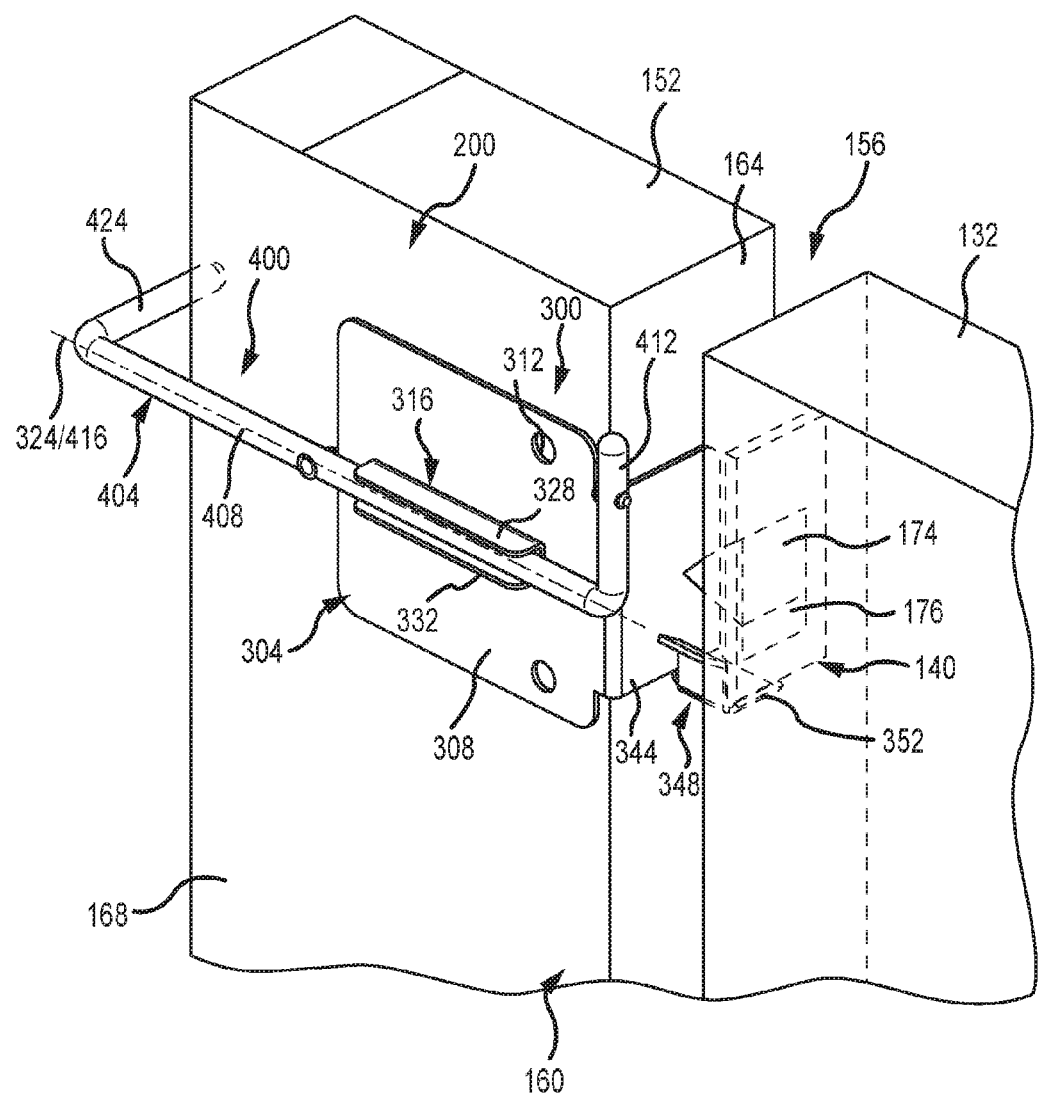
FIG. 5 is a perspective view similar to that of FIG. 3 but from a different angle and including both the base member and a tool of the power switch manipulation apparatus.
Figure 7A:
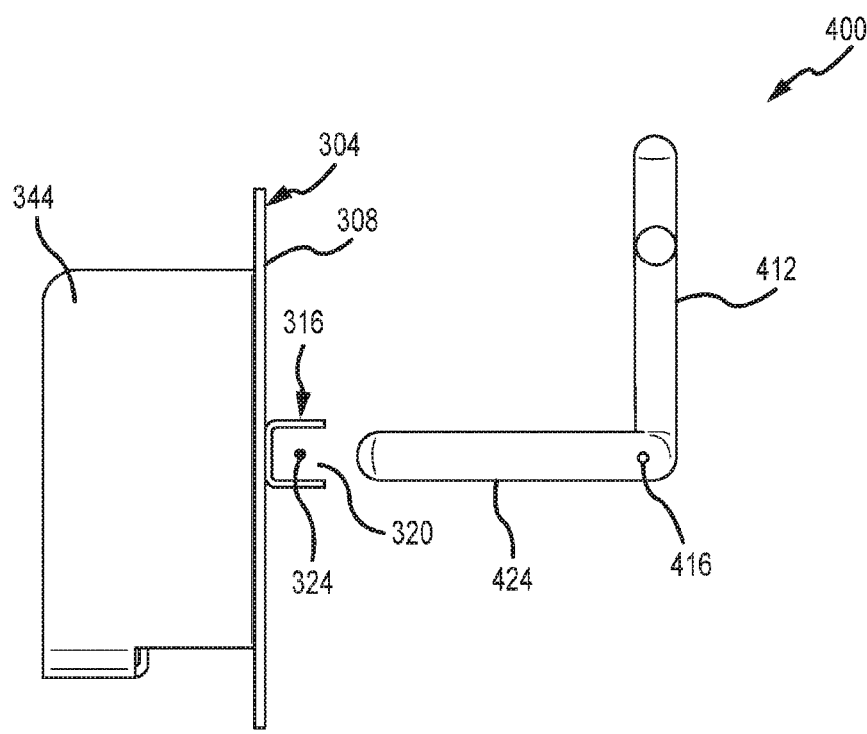
FIG. 7a is a front view illustrating a process of inserting the tool into a guide channel of the base member of the power switch manipulation apparatus of FIG. 5.
Figure 7B:
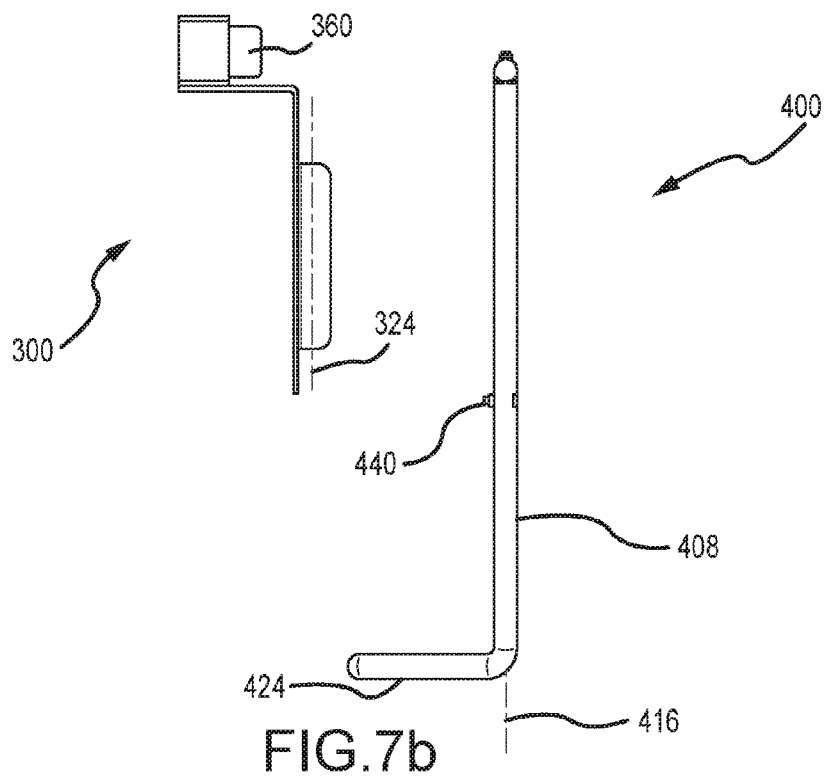

As shown, the base member 300 may include a location apparatus 348 (e.g., one or more brackets, clips, etc.) rigidly (e.g., non-movably) attached or connected to the second leg 344 so as to extend or protrude into the vertical slot 156. In one arrangement, the location apparatus 348 may include an alignment member or tab 352 that is configured to contact a portion of a power switch 140 (e.g., a bottom portion of the power switch 140 as shown in FIG. 5) so as to stop and locate the base member 300 adjacent the power switch 140 (e.g., at a substantially similar height in the rack as the power switch 140) during installation of the base member 300 (e.g., such as when an installer places the first and second legs 308, 344 substantially flush against the front and side surfaces 168, 164 of the vertical member 152 between adjacent power switches 140 and slides the base member 300 upwards until the alignment tab 352 contacts or otherwise catches on the bottom portion of the power switch 140 (e.g., on a bottom portion of a bezel of the power switch 140 that surrounds a toggle member 172 of the power switch 140) to prevent or inhibit further upward movement of the base member 300). More particularly, the alignment tab 352 locates the base member 300 relative to the power switch 140 so that the longitudinal axis 324 of the guide channel 320 is at a height in the storage rack 100 the same or similar as that of the power switch 140 (e.g., such as, as shown in the figures, a height in the storage rack 100 the same or similar as that of a first 174 of first and second portions 174, 176 of the toggle member 172 of the power switch 140, where manipulation of the first portion 174 is an "on" position of the power switch 140 and manipulation of the second portion 176 is an "off" position of the power switch 140, or vice versa).

Additionally or alternatively, the location apparatus 348 may include a stop member or tab 356 (removed from FIG. 3 for clarity, but see FIGS. 5-6) that is configured to inhibit further rotation of the tool 400 about the longitudinal axis 324 of the guide channel 320 so as to position a manipulation portion (e.g., second arm 412 as discussed below) of the tool 400 in front of a particular one of the first and second portions 174, 176 of the toggle member 172 (e.g. in front of the second portion 176 as discussed below). For instance, the stop tab 356 may protrude upwardly away from a base (not labeled) of the location apparatus 348 so as to point in a direction out of the vertical slot 156 and provide an angled platform 360 that is configured to receive the manipulation portion of the tool 400 and inhibit further rotation of the manipulation portion of the tool 400 (and thus the tool 400 as a whole) once the manipulation portion has reached a position directly in front of the second portion 176 of the toggle member 172. The particular angle that the platform 360 forms relative to a horizontal plane through the longitudinal axis 324 of the guide channel 320 (so as to stop further rotation of the tool 400 when the manipulation portion of the tool has reached a position in front of the second portion 176 of the toggle member 172) may depend on, for instance, the distance between the centers of the first and second portions 174, 176 of the toggle member 172, the height of the longitudinal axis 324 relative to that of the first and/or second portion 174, 176, and/or the like. While the alignment and stop tabs 352, 356 are illustrated as being part of a single, integral piece that protrudes from the second leg 344, it is also envisioned that the alignment and stop tabs 352, 356 could be separate pieces that each respectively extends from the second leg 344 or that is otherwise formed on the second leg 344. Furthermore, while only a single stop tab 356 is shown, one or more additional stop tabs could be included to inhibit further rotation of the tool in other rotational positions of the second arm 412.

With continued reference to FIGS. 5-6, the tool 400 is generally receivable in the guide channel 316 of the base member 300 for rotation about and translation along the longitudinal axis 324 of the guide channel 320 so that the manipulation portion of the tool 400 can appropriately manipulate the power switch 140 (e.g., by contacting and pushing the first or second portions 174, 176 of the toggle member 172 as appropriate). Generally, the tool 400 may include a body 404 including at least a first arm 408 that is receivable in the guide channel 320 and rotatable about and translatable along the longitudinal axis 324 of the guide channel 320. For instance, the first arm 408 may be in the form an elongated member (e.g., rod, shaft, etc.) having a cross-sectional shape and size that allows it to rotate about the longitudinal axis 324 when received in the guide channel 320. The body 404 may also include a second arm 412 that is rigidly attached to or at least non-movable relative to the first arm 408 in a manner so that upon rotation of the first arm 408 about the longitudinal axis 324, the second arm 412 is automatically positioned into the vertical slot 156 into a rotational position in front of the power switch 140. In this regard, the first arm 408 may be of a length substantially equal to or greater than a distance between the rear opening 124 and the vertical slot 156 (e.g., or other location where the switch 140 is located).

In one arrangement, the second arm 412 may be rigidly attached to a first end of the first arm 408 and non-movably attached thereto at a non-parallel angle so that upon rotation of the first arm 408 about the longitudinal axis 324 of the guide channel 320, the second arm 412 may reach into the vertical slot 156 at a position in front of the switch 140. For instance, a longitudinal axis 416 of the first arm 408 may be substantially perpendicular to a longitudinal axis 420 of the second arm 412 so that the second arm 412 may be substantially flush with a front of the power switch 140 when the second arm 412 reaches into the slot 156. In one arrangement, the first and second arms 408, 412 may be a single piece of material (e.g., bar stock, rod, etc.) that is appropriately bent to form the first and second arms 408, 412. In other arrangements, the first and second arms 408, 412 may be separate pieces that are appropriately rigidly attached together. In further arrangements, one or more additional arms may rigidly and non-movably interconnect the first arm 408 to the second arm 412.

As will be discussed below, a user may grasp and manipulate the first arm 408 to induce the second arm 412 to manipulate the power switch 140. In one arrangement, the user may grasp a portion of the first arm 408 adjacent an opposite end thereof (i.e., an end opposite the end that is attached to the second arm 412). For instance, any appropriate non-slip member (e.g., rubber, plastic, etc.) may be attached to or otherwise formed over the opposite end of the first arm 408 to facilitate grasping thereof. As another example, and as shown in FIGS. 5-6, the body 404 of the tool 400 may include a third arm 424 rigidly or non-movably attached to or relative to the opposite end of the first arm 408 and configured to be grasped by a user to manipulate the tool 400. For instance, the third arm 424 may extend along a longitudinal axis 428 that is non-parallel (e.g., perpendicular or the like) to the longitudinal axis 416 of the first arm 408 to provide a mechanical advantage that allows the user to more easily torque or rotate the first arm 408 about the longitudinal axis 324 of the guide channel 320. In one arrangement, the longitudinal axis 428 of the third arm 424 may also be non-parallel (e.g., perpendicular) to the longitudinal axis 420 of the second arm 412. The third arm 424 may be part of a single piece along with the first and second arms 408, 412 that is appropriately bent or otherwise manipulated to form the first, second and third arms 408, 412, 424 or may be a separate piece that is appropriately attached to the first arm 408.

To facilitate the reader's understanding of the various functionalities of the power switch manipulation apparatus 200, one method of installation and use of the apparatus 200 will now be discussed although it is to be understood that other methods (including more, fewer, or different steps than those specifically discussed) consistent with the teachings presented herein are also envisioned and encompassed in the present disclosure. With reference to FIGS. 2-5, a user may initially insert the second leg 344 of the base member 300 into the storage rack 100 guide it into the vertical slot 156 between adjacent power switches 140 and then press the first leg 308 substantially flush against the front surface 168 of the vertical member 152. The user may then slide the base member upwards until the alignment tab 352 catches on a power switch 140 at which point the user may rigidly secure the base member 300 to the vertical member 152 (e.g., such as by inserting fasteners through apertures 312 in the first leg 308 and/or in other manners). In one arrangement, the alignment tab 352 may be positioned on the second leg 344 in a manner that allows a user to slide the base member 300 downwardly until the alignment tab 352 catches on a top portion of a power switch 140 instead of the bottom portion (e.g., when the alignment tab 352 extends from a top portion of the second leg 344 instead of a bottom portion as shown in the figures). In any case, the user may repeat the above process with additional base members 300 for additional power switches 140 in the storage rack 100.

The user may also position the tool 400 into the guide channel 320 of the base member 300 such as by inserting the first and second arms 408, 412 into the space 128 (e.g., such that a plane through the longitudinal axes 416, 420 of the first and second arms 408, 412 is parallel to the first arm 408 of the base member 400 or otherwise vertical) so that the second arm 412 at least just passes the guide channel 320 and then laterally moving the tool 400 (e.g., in a direction perpendicular to a front surface of the first leg 408) to insert the first leg 408 into the guide channel 320 so that the longitudinal axis 416 of the first leg 408 coincides with the longitudinal axis 324 of the guide channel 320. Compare FIGS. 7a-7b to FIGS. 8a-8b. Inserting the tool 400 into the space 128 such that a plane through the longitudinal axes 416, 420 of the first and second arms 408, 412 is parallel to the first arm 408 of the base member 400 or otherwise vertical advantageously reduces the form factor of the tool 400 in the x-dimension (e.g., across the rear opening 124) to limit contact between the tool 400 and any componentry 136 disposed in the space 128.

Figure 8A:
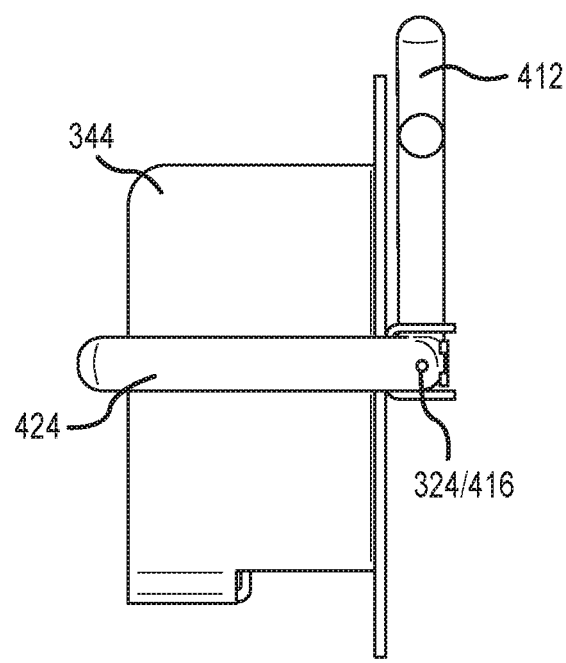
FIG. 8a is a front view of the power switch manipulation apparatus of FIG. 5 illustrating the tool being received in the guide channel of the base member.
Figure 8B:
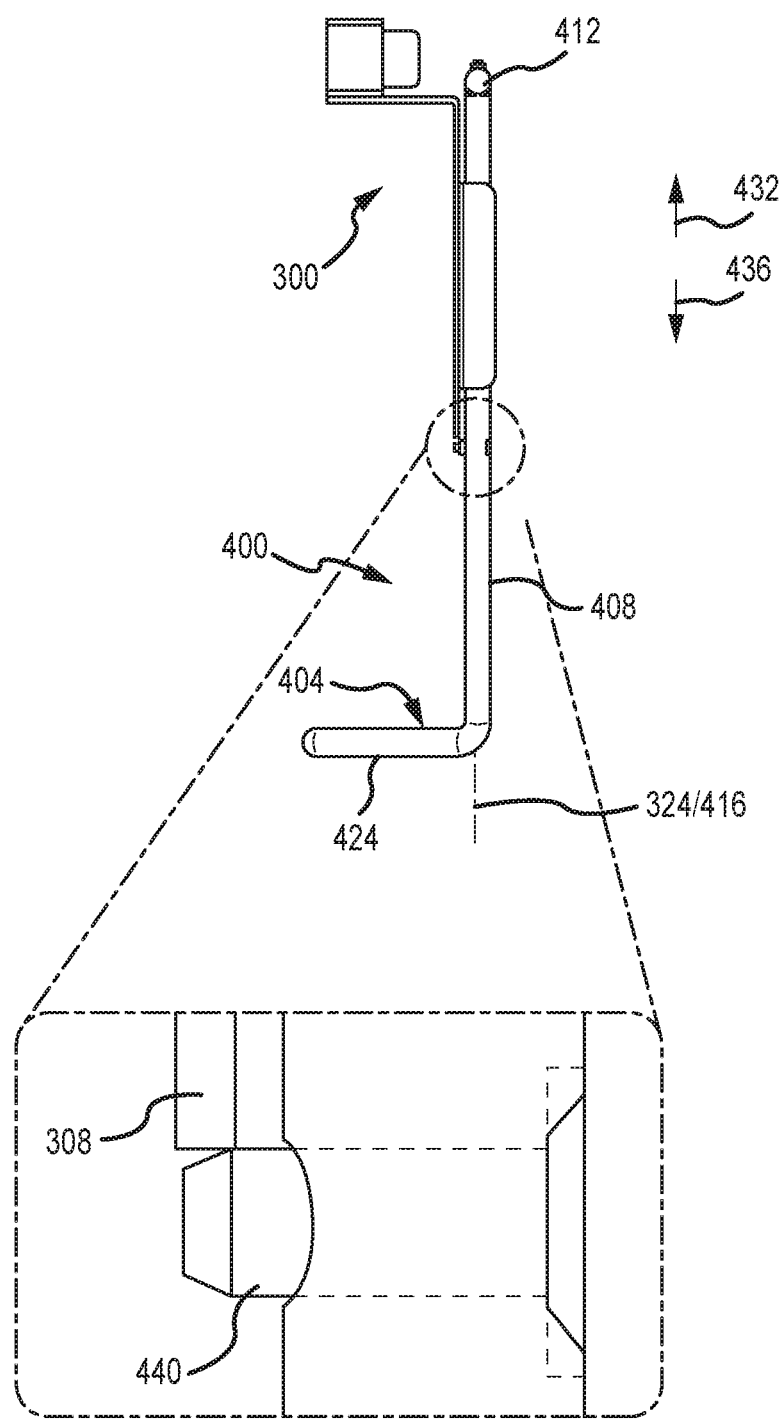

Once the first leg 408 is received in the guide channel 320, the user may appropriately slide (e.g., urge, push) the first leg 408 along the longitudinal axes 324, 416 in first and/or second opposite directions 432, 436 so that the second arm 412 has generally aligned with the vertical slot 156. See FIGS. 5 and 8. Stated differently, the first leg 408 may be slid so that the second leg 412 has passed the second arm 344 of the base member 300 but has not passed the power switch 140. In one arrangement, the tool 400 may include an alignment feature that facilities the above positioning of the second arm 412. For instance, the first arm 408 may include an alignment protrusion 440 (e.g., pin, tab, etc.) thereon or extending therefrom that is configured to contact a portion of the base member 300 (e.g., an edge of the first leg 308) as the user is sliding the first arm 408 along the longitudinal axes 324, 416 in the first direction 432 to inhibit further sliding movement of the first arm 408 in the first direction right as the second arm 412 has been positioned as above (e.g., absent rotation of the first arm 408 about the longitudinal axes 324, 416). With reference to FIG. 8b, for instance, a user may initially position the first leg 408 in the guide channel 320 of the base member 300 so that a gap exists between the alignment protrusion 440 and the edge of the first leg 308. Thereafter, pushing of the first leg 408 (e.g., first grasping and urging of the third leg 424) in the first direction 432 will be inhibited when the alignment protrusion 440 contacts the edge of the first leg 308 as shown in FIG. 8a.

The first arm 408 may now be rotated in one of a clockwise or counterclockwise direction about the longitudinal axes 324, 416 to position the second arm 412 in front of the power switch 140 so that the power switch 140 can be manipulated. For instance, a user may grasp the third arm 424 of the tool 400 and rotate the tool 400 in a counterclockwise direction by 90° to rotate the second arm 412 from a first rotational position as shown in FIGS. 5, 8a, and 8b to a second rotational position whereby it reaches into the vertical slot 156 and is positioned in front of the first portion 174 of the toggle member 172 of the power switch 140 (e.g., in the case where the longitudinal axes 324, 416 are positioned at the same height in the rack 100 as is the first portion 174 of the toggle member 172). Compare FIGS. 8a-8b and FIGS. 9a-9b. That is, rotation of the first arm 408 about the longitudinal axes 324, 416 induces rotation of the longitudinal axis 416 of the second arm 412 about the longitudinal axis 412 of the firm 408. In the event the longitudinal axes 324, 416 were positioned at a height different than that of the first portion 174, the tool 400 may be rotated by other amounts to position the second leg 412 in front of the first portion 174.

Figure 10:
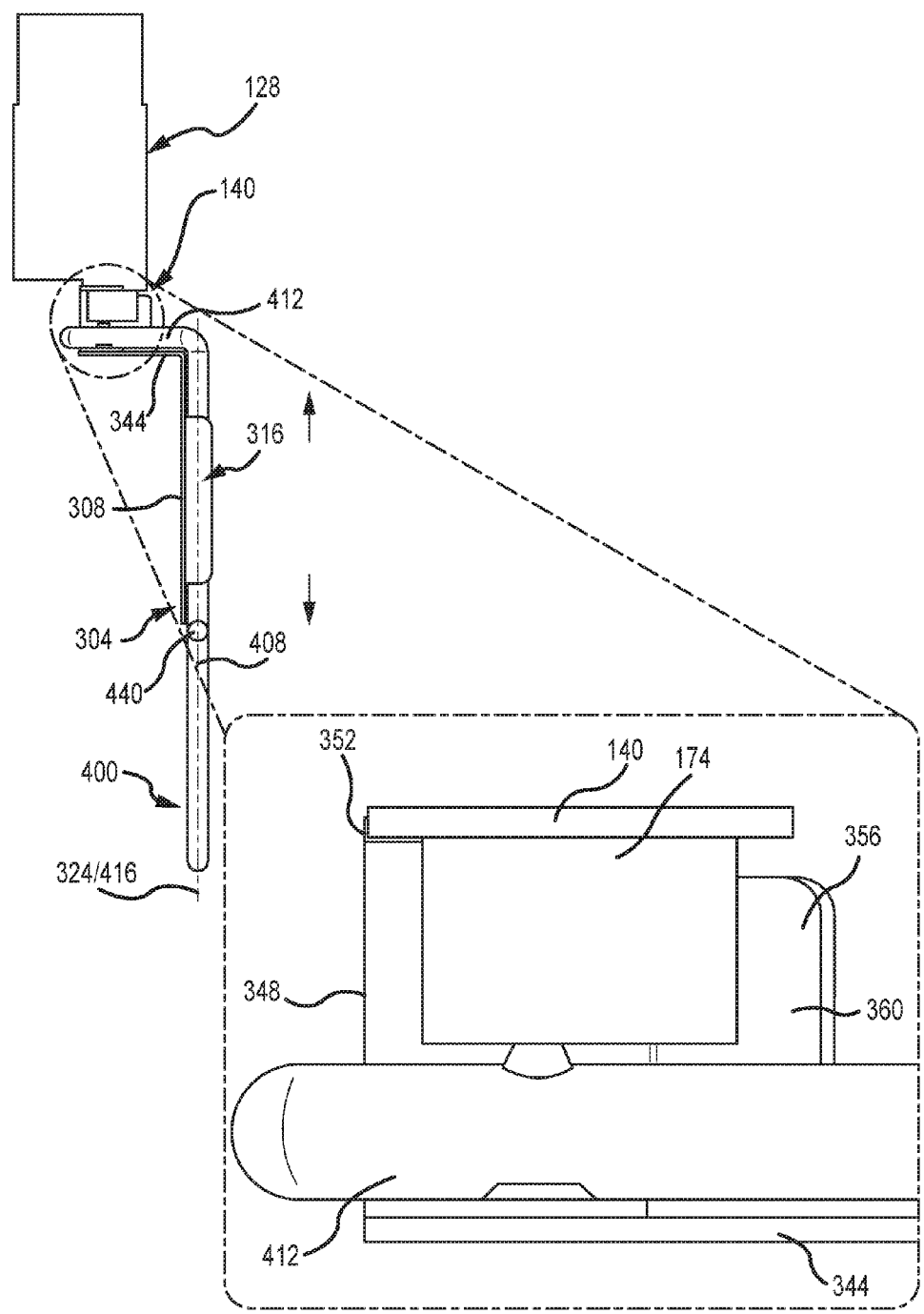
FIG. 10 is plan view similar to FIG. 9b but after the tool has been urged along the longitudinal axis of the guide channel so as to engage a power switch into an on position.

With the second arm 412 in the second rotational position shown in FIGS. 9a, 9b and 10, the user may urge the first arm 408 in the first direction 432 along the longitudinal axes 324, 416 (e.g. via pushing the third arm 424) to cause the second arm 412 to contact and manipulate (e.g., depress) the first portion 174 of the toggle member 172 so as to position the power switch 140 in one of an on or off position (e.g., as shown, into an on position). With reference to FIGS. 9b and 10, it can be seen how rotating the second arm 412 into the second rotational position clears the protrusion member 440 from the first leg 308 of the base member so that the first arm 408 can be pushed along the longitudinal axes 324, 416 in the first direction 432.

Figure 11A:
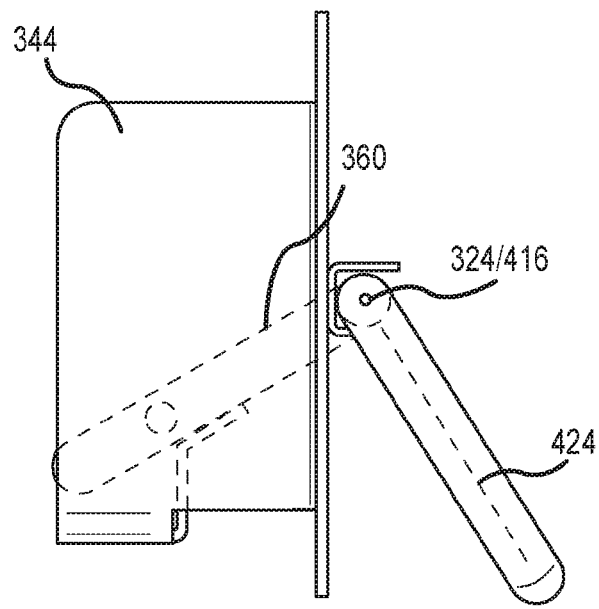
Figure 11B:
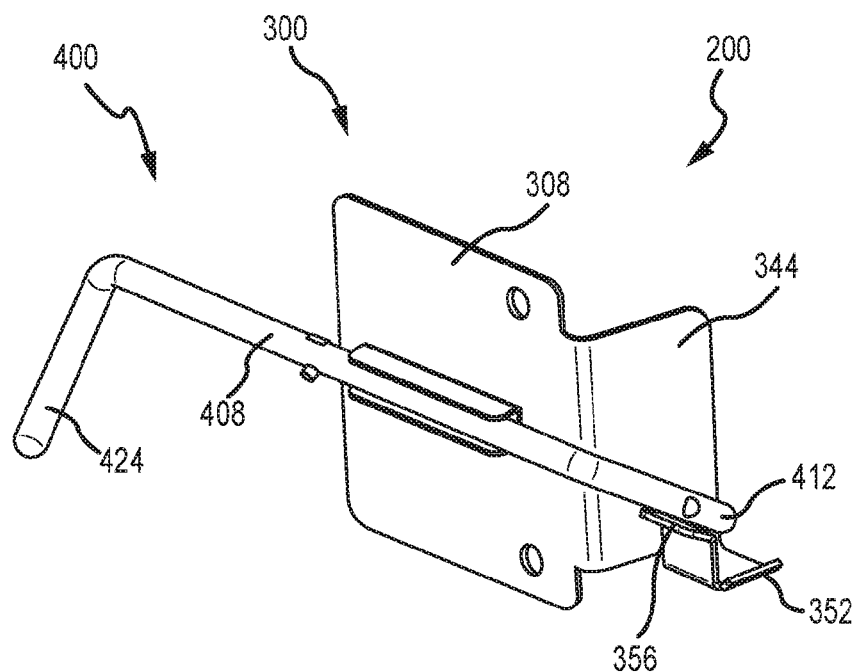

To manipulate the second portion 176 of the toggle member 172 (e.g., to turn the power switch off), the user may continue rotating the first arm 408 in the one of the clockwise or counterclockwise directions (e.g., as shown, in the counterclockwise direction) to position the second arm 412 in a third rotational position that is in front of the second portion 176. The particular amount of rotation may depend on the dimensions of the toggle member 172 (e.g., height and width of first and second portions 174, 176). For instance, the user may rotate the tool 400 by an additional approximate 30° (or a total of about 120° from the starting position shown in FIG. 8a) to position the second arm 412 in front of the second portion 176. As discussed previously, the platform 360 of the stop member 356 may advantageously inhibit further rotation of the tool 400 about the longitudinal axes 324, 416 just as the second arm 412 has reached its position in front of the second portion 176. See FIGS. 11a-11b (power switch 140 not shown for clarity, but also see FIG. 5). Once in the third rotational position, the user may slide the tool along the longitudinal axes 324, 416 to manipulate the second portion 176 of the toggle member 172. In some arrangements, the user may have to slightly adjust the longitudinal position of the first arm 408 along the longitudinal axis 324, 416 (e.g., in the first and/or second directions 432, 436) between the second and third rotational positions of the second arm 412.

A user may utilize the same tool 400 to manipulate a plurality of power switches 140 in the storage rack 100. For instance, a user may sequentially insert the tool 400 into guide channels 324 of a plurality of base member 300 and rotate and push the tool 400 in each guide channel 324 to turn on or turn off each of the power switches as appropriate. In some arrangements, the user may turn the tool 400 directly into the third rotational position of the second arm 412 in front of the second portion 176 (e.g., to position the power switch 140 into an off position). In other arrangements, the user may turn the tool directly into the second rotational position of the second arm 412 in front of the first portion 174 (e.g., to position the power switch 140 into an on position).

While shown as being mounted on one side of the rack 100, it is also to be understood that the manipulation apparatus 200 could also be mounted on the other side of the rack 100 when the power switches 140 are disposed on the other side of the rack. When doing so, for instance, the base member 300 may be mounted in an upside down manner (flipped by 180°) and the tool 400 may start from a position that is 180° from the starting position shown in FIG. 8a. The tool 400 may however be rotated in the same one of the clockwise or counterclockwise directions as when the base member 300 is mounted as shown in the figures. Also, in the event the power switches 140 were located on an opposite wall, such as the side wall 164 of the vertical member 152, the user may urge (e.g., pull) the tool 400 in the second direction 436 along the longitudinal axes 324, 416 to manipulate the power switches 140.

Figure 12A:
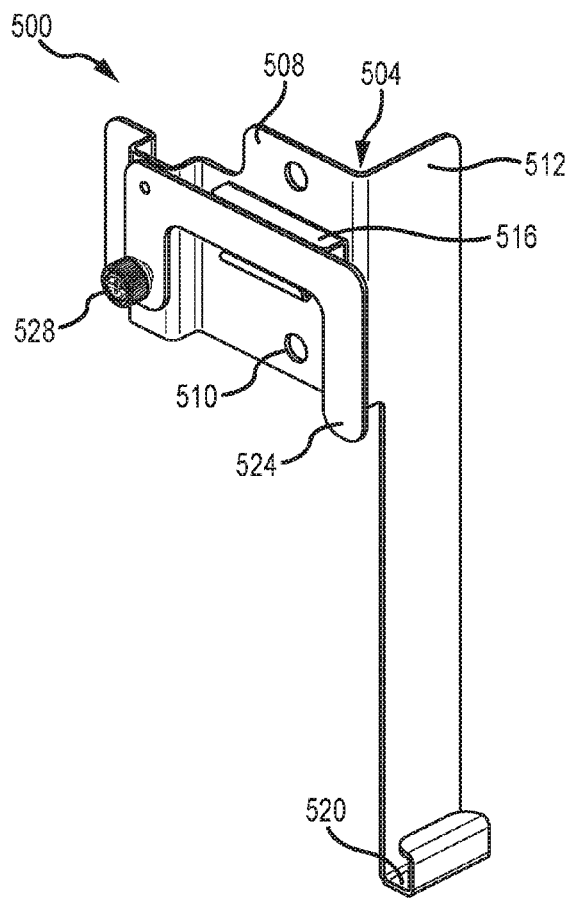
FIG. 12a is a front isometric view of a holder for a tool, such as the power switch manipulation apparatus of FIG. 5.
Figure 12B:
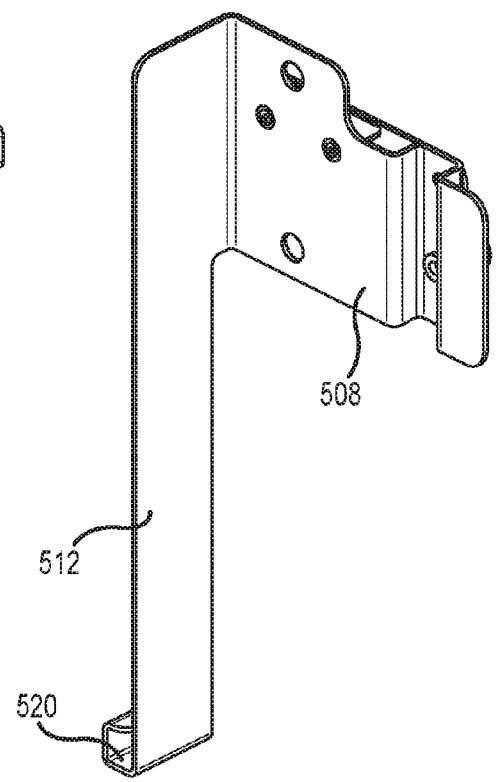

FIGS. 12a-12b illustrate one embodiment of a holder 500 (e.g., storage mechanism) for a tool such as the tool 400 of the manipulation apparatus 200 that may be secured in any convenient location (e.g., such as on an upper portion of the rack 100 or the like) to limit loss of the tool and facilitate location of the tool when needed. Broadly, the holder 500 may include a body 504 (e.g., one or more brackets or the like) including at least a first leg 508 (e.g., bracket, sheet member, etc.) that is configured to be attached to any appropriate portion of the rack 100 (e.g., such as extending fasteners through apertures 510 in the first leg 508 and into corresponding apertures in a top portion of the vertical member 152 or in another member of the frame of the storage rack 100). The holder 500 may also include a securement member 516 defining a channel 518 attached to or formed by the first leg 508 within which a portion of the tool 400 (e.g., third arm 424) may be selectively fixably received. In one arrangement, the securement member 516 may be in the form of a clip that is configured to clamp around the portion of the tool 400 when the tool 400 is forced into the channel 518. In another arrangement, the securement member 516 may be similar in shape to the guide member 320 of the base member 300.

Figure 13B:
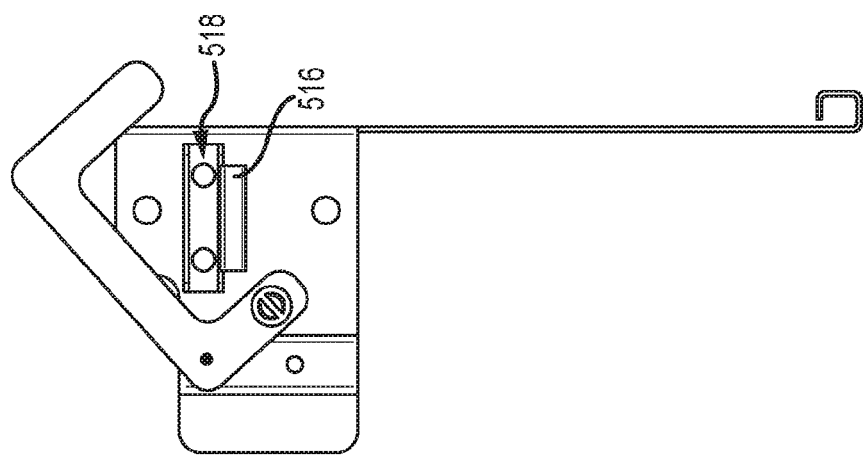
FIG. 13b is similar to FIG. 13a but with the door being in a closed position.
Figure 13A:
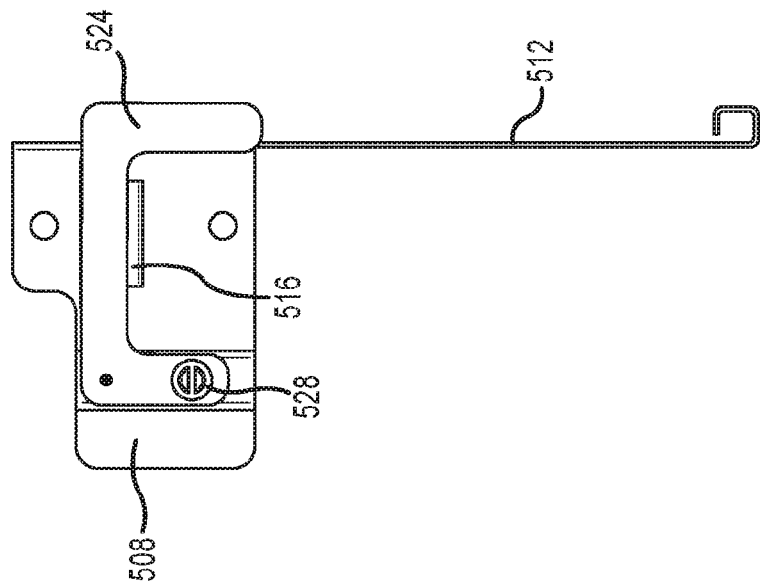
FIG. 13a is a front view of the holder of FIG. 12a with a door of the holding being in a closed position.
Figure 14:
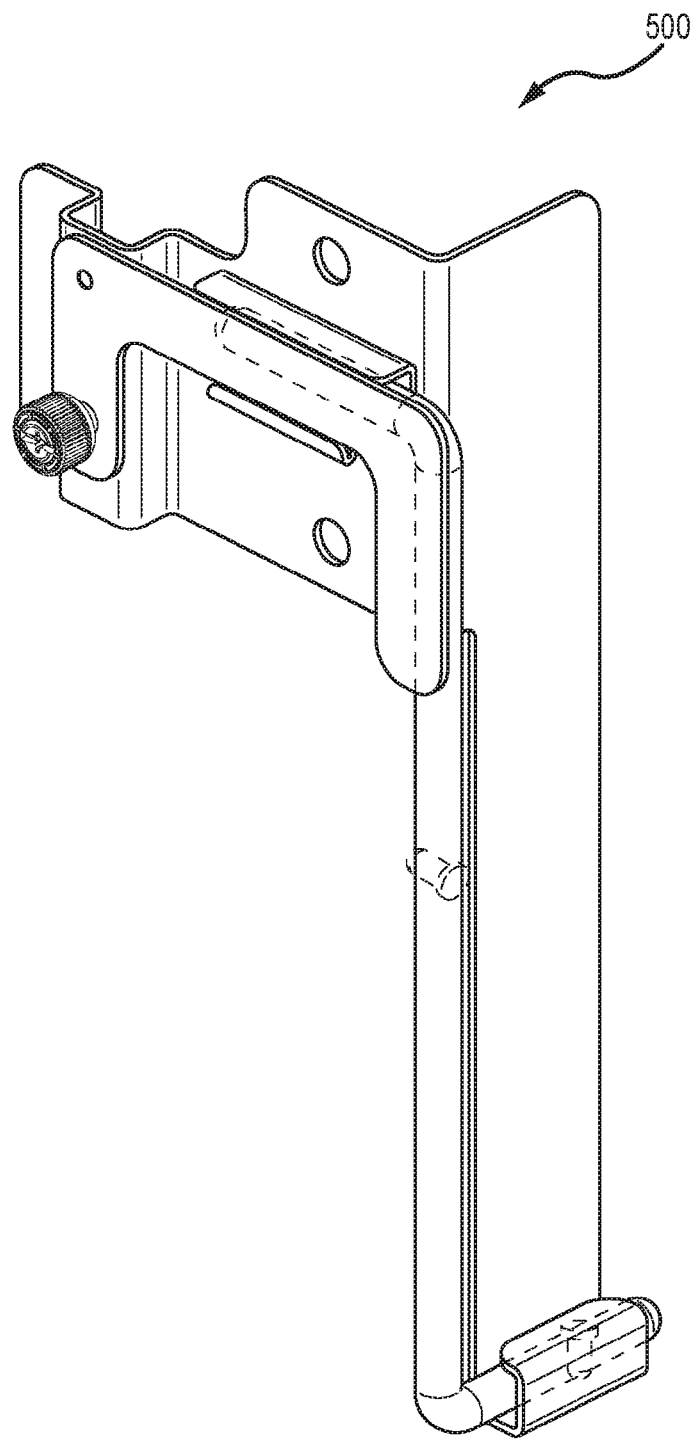
FIG. 14 is a front isometric view of the holder similar to that in FIG. 12a but with the tool being loaded in the holder and the door being in the closed position.

In one variation, the holder 500 may include a pivotal door 524 that is configured to selectively cover the opening to the channel 518 after the portion of the tool 400 has been received therein. As just one example, a user may loosen a threaded fastener 528 (e.g., thumb screw) about which the door 524 is configured to pivot or rotate and then pivot the door 524 away from the channel 518 to allow access to the channel 518. Compare FIGS. 13a-13b. The user may then insert the third leg 424 into the channel 518 and pivot the door 524 back over the channel 518 and tighten down the threaded fastener 528 to secure the third leg 424 in the channel 518. See FIG. 14.

In one arrangement, the body 504 may additionally include a second leg 512 (e.g., bracket, sheet member, etc.) rigidly attached to the first leg 508 and that is configure to constrain or secure another portion of the tool 400. For instance, the holder 500 may include another securement member defining a channel 520 attached to or formed by the second leg 512 within which another portion of the tool 400 (e.g., second arm 412) may be selectively fixably received. In one arrangement, the securement member may be in the form of a clip that is configured to clamp around the other portion of the tool 400 when the tool 400 is forced into the channel 520. In another arrangement, an end of the second arm 412 of the tool 400 may be inserted into a side of the channel 520 (e.g. in a direction into the page in FIG. 13b). Respective longitudinal axes (not labeled) of the channels 518, 520 of the securement members may be oriented relative to each other in a manner similar to how the longitudinal axes 428, 416 of the third and second arms 424, 412 are oriented relative to each other.

Figure 20:
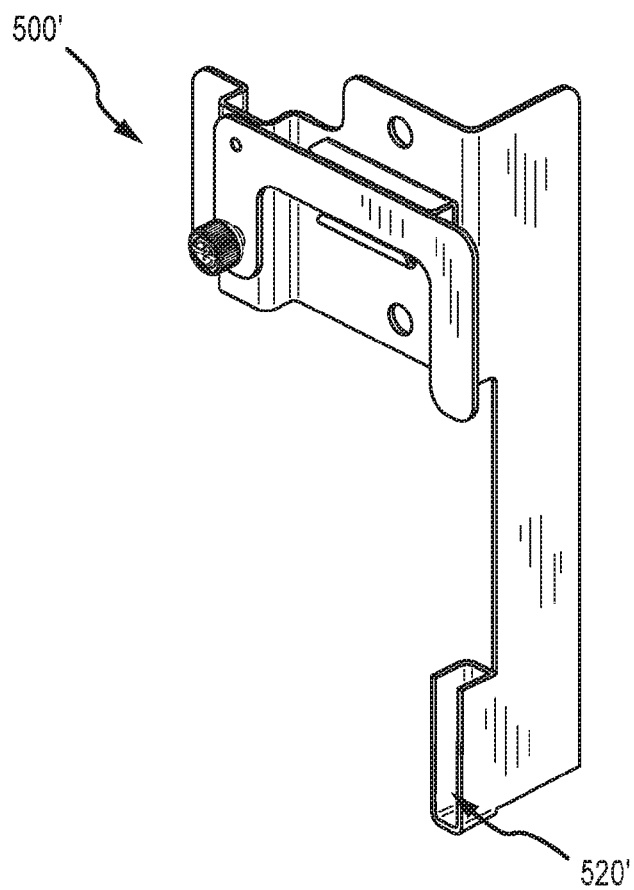
FIG. 20 is an isometric view of a holder for a tool according to another embodiment.
Figure 21:
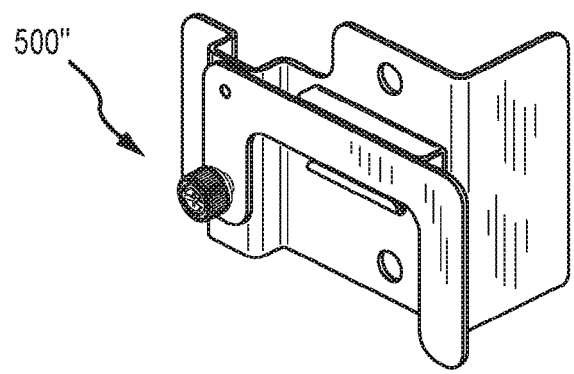
FIG. 21 is an isometric view of a holder for a tool according to another embodiment.

In one arrangement, and as shown in FIGS. 12a-14, the first and second legs 508, 512 may be perpendicularly positioned relative to each other to allow the first and second legs 508, 512 to respectively lie flush against first and second perpendicular surfaces of a portion of the frame of the storage rack 100 (e.g., such as front and side surfaces 168, 164 of vertical member 152). While discussed in the context of holding tool 400, it is to be understood that the holder 500 may be used to hold, secure and store other tools used in other contexts. In this regard, FIGS. 20-21 present isometric views of other embodiments of the holder 500', 500" that may be appropriately attached to a surface (e.g., storage rack, other surfaces, etc.) for holding and storing various types of tools. In FIG. 20, for instance, the securement channel 520' is oriented perpendicular to the securement channel 520 of FIG. 12a but is still perpendicular to the securement channel 518. In FIG. 21, the holder 500" is devoid of a securement channel on the second leg.

Figure 15:
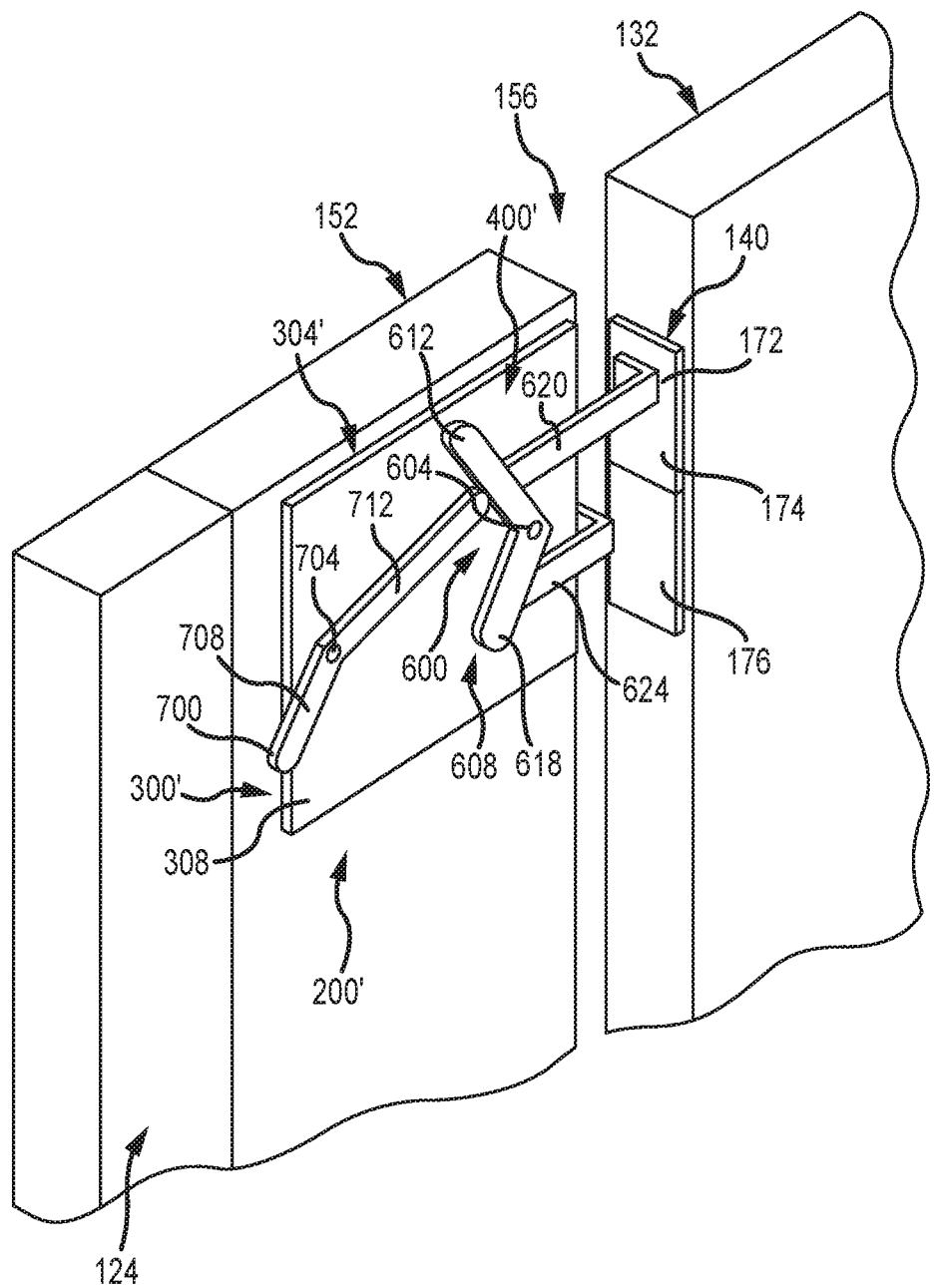
FIG. 15 is a close-up rear perspective view of the storage rack but including another embodiment of the power switch manipulation apparatus, where the power switch manipulation apparatus has manipulated the power switch into an on position.

FIG. 15 illustrates another embodiment of the manipulation apparatus 200' that is configured to allow users to manipulate switches within the storage rack 100, such as one or more of the power switches 140 of the PDU 132, free of having to physically reach into the storage rack 100 (e.g., into or through space 128 via rear opening 124) to manipulate the power switches 140. Broadly, the manipulation apparatus 200' includes a base member 300' and a tool 400' that is movably mounted to the base member 300' in a manner that allows a user manipulate one of the power switches 140. In one arrangement, the base member 300' may include a body 304' having at least a first leg 308' (e.g., bracket, sheet member, etc.) that may be appropriately rigidly or non-movably secured to the vertical member 152 similar to how the first leg 308 of the manipulation apparatus 200 may be secured to the vertical member (e.g., via inserting fasteners through apertures in the first leg 308', not shown, and/or in other manners). For instance, the first leg 308' may be secured at height substantially the same as a height of a particular one of the power switches 140 in the storage rack 100. While not shown, the body 304' may in one embodiment include a second leg with an alignment member (e.g., alignment member 352 of FIGS. 3 and 5) configured to catch on a portion of a power switch 140 to facilitate location of the base member 300' adjacent the same.

The tool 400' may be in the form of a mechanical linkage pivotally attached to the body 304' of the base member 300' that is configured to manipulate the power switch 140 upon manipulation of the tool 400' by a user and that is configured to be manipulated by the power switch 140 upon tripping of the power switch 140 to provide a visual indication to a user of a tripped condition. Broadly, the tool 400' may include a rocker assembly 600 pivotally attached to the body 304' at pivot point 604 (e.g., via a rivet or the like so as to pivot about a pivot axis that is perpendicular to the body 304') and configured to manipulate or be manipulated by the power switch 140. The tool 400' also includes an actuation arm 700 pivotally attached to the body 304' at pivot point 704 (e.g., via a rivet or the like so as to pivot about a pivot axis that is perpendicular to the body 304' and parallel to the pivot axis of the rocker assembly 600) that is configured to manipulate the rocker assembly 600 (e.g., upon application of a force by a user) or be manipulated by the rocker assembly 600 (e.g. upon application of a force by the power switch 140, such as by first portion 174 of the trigger assembly 172 popping out in a direction towards the rocker assembly 600).

The rocker assembly 600 may include a rocker arm 608 (e.g., bracket) including first and second portions 612, 616 that are rigidly attached to each other at any appropriate angle (e.g. such as an obtuse angle as shown), where the concave portion of the rocker arm 608 faces away from the power switch 140, and where the pivot point 604 is disposed between the first and second portions 612, 616 so that the first and second portions 612, 616 can pivot or rock about the pivot axis through the pivot point 604. The rocker assembly 600 also includes first and second rocker legs 620, 624 respectively attached to the first and second portions 612, 616 of the rocker arm 608 in any appropriate manner and configured to reach away from the first and second portions 612, 616 and into the vertical slot 156 in front of the first and second portions 174, 176 of the toggle member 172.

For instance, the first and second rocker legs 620, 624 may be in the form of rigid bands, rods, or the like that have a first portion (not labeled) attached to the first and second portions 612, 616 and a second portion (not labeled) angled relative to the first portion (e.g., at a perpendicular angle as shown) to allow the first and second legs 620, 624 to reach into the vertical slot 156 in front of the first and second portions 174, 176 of the toggle member 172. In one arrangement, the first and second rocker legs 620, 624 may be rigidly or non-movably attached to the first and second portions 612, 616 (e.g., such as by welding, or in the case of a one piece member). In another arrangement, the first and second rocker legs 620, 624 may be connected to the first and second portions 612, 616 via any appropriate flexible or movable joint or connection to maintain the first and second rocker legs 620, 624 in a horizontal position when the rocker arm 608 is forced to pivot about its pivot axis at the pivot point 604.

The actuation arm 700 may include first and second portions 708, 712 that are rigidly attached to each other at any appropriate angle (e.g., an obtuse angle as shown in FIG. 15). The first portion 708 is configured to be manipulated by a user and provide a visual indication to a user of a tripped condition of the power switch 140 and the second portion 712 is configured to manipulate the first and second portions 612, 616 of the rocker arm 608 to induce contact between the first and second rocker legs 620, 624 and the first and second portions 174, 176 of the toggle assembly 172 of the power switch 140.

Figure 16A:
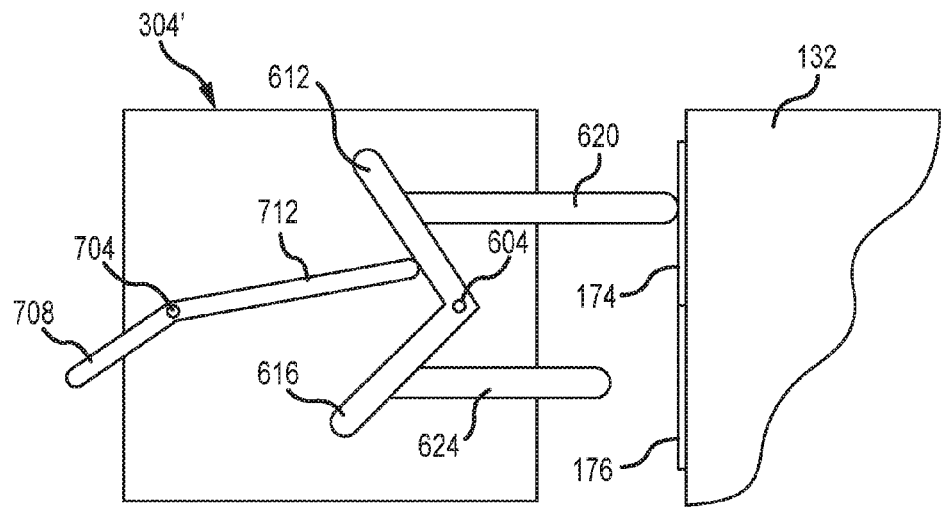
FIG. 16a is a front view of the power switch manipulation apparatus of FIG. 15.

FIGS. 15 and 16a illustrate a first position of the tool 400' in which the tool 400' has been manipulated by a user to depress or otherwise manipulate the first portion 174 of the toggle assembly 172 so as to position the power switch 140 in an on position. To reach the position shown in FIGS. 15 and 16a, a user may depress the first portion 708 of the actuation arm 700 (e.g., push in a downward direction) to induce rotation of the actuation arm 700 about its pivot axis through pivot point 704 in one of a clockwise or counterclockwise direction (e.g., as shown, in a counterclockwise direction). Upon depression of the first portion 708, the second portion 712 also rotates in the same counterclockwise direction and forcibly slides along the first portion 612 of the rocker arm 608 to induce clockwise rotation of the rocker arm 608 about its pivot axis through pivot point 604 and simultaneous movement of the first rocker leg 620 against first portion 174 of the toggle assembly 172 to depress the first portion 174. Stated otherwise, the tool 400' essentially forms a cam that translates the rotation of the actuation arm 700 into at least somewhat linear movement of the first and second rocker legs 620, 624. In one arrangement, any appropriate stop or limiting member may be attached to the base member 300' or the like to inhibit further rotation of the actuation arm 700 in the counterclockwise direction (and thus further rotation of the rocker arm 600 in the clockwise direction) past that shown in FIGS. 15 and 16a.

In one embodiment, the actuation arm 700 or rocker assembly 600 may be configured to trigger any appropriate visual indication apparatus upon reaching the position shown in FIGS. 15 and 16a to provide a visual indication to a user that the first portion 174 of the power switch 140 has been depressed (e.g., that the power switch 140 is in an on position). For instance, respective push buttons (not shown) may be appropriately placed near two end positions of the actuation arm 700, such as that shown in FIGS. 15 and 16a and that shown in FIG. 16b (discussed below). The push buttons may then be appropriately wired to a different colored indicators (e.g., green and red LEDs) via resistors, where a battery or other alternative power source may be connected to the system to light up a respective LED when its corresponding button is depressed or triggered by the actuation arm 700.

Figure 16B:
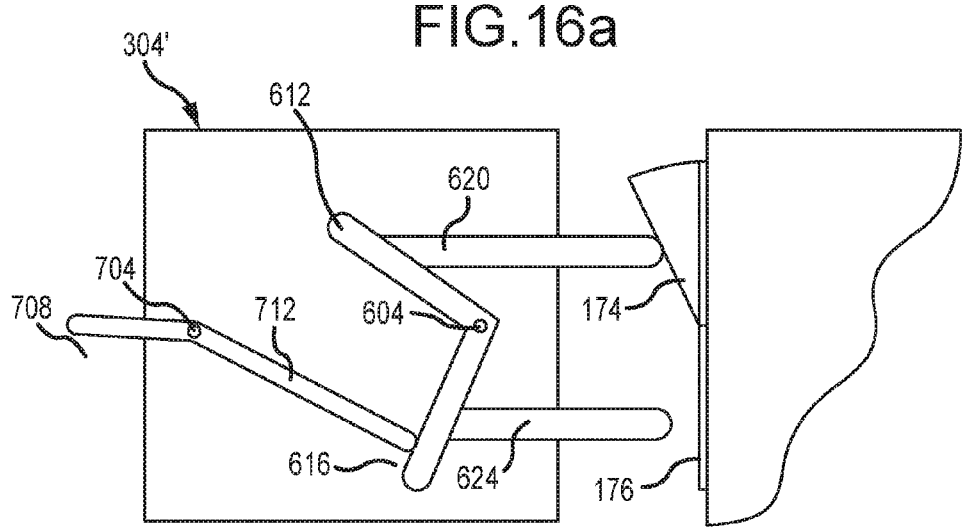
FIG. 16b is a front view of the power switch manipulation apparatus of FIG. 15 but after the power switch has been tripped to manipulate the power switch manipulation apparatus into a different position.

In any case, FIG. 16b illustrates another position of the tool 400' after the power switch 140 has tripped (e.g., so that the first portion 174 of the toggle assembly 172 has popped outwardly in a direction towards the manipulation apparatus 200'). As shown, the first portion 174 of the toggle assembly 172 has applied a force against the first rocker arm 620 that pushes the first portion 612 of the rocker arm 608 in a counterclockwise direction from its position shown in FIG. 16a and which simultaneously forces the actuation arm 700 to rotate in a clockwise direction from its position shown in FIG. 16a. More particularly, the counterclockwise movement of the rocker arm 608 from its position shown in FIG. 16a induces the end of the second portion 712 of the actuation arm 700 to slide downwardly along the rocker arm 608 from the first portion 612 onto the second portion 616, such as towards an end of the second portion 616 near or past where the second portion 616 attaches to second rocker arm 624. As shown, the first portion 708 of the actuation arm 700 has moved clockwise into a different position than that shown in FIG. 16a (e.g., such as a position where it is sticking straight out from the base member 300' as shown in FIG. 16b). This position of the first portion 708 may visually represent to a user that the power switch 140 has been tripped and may be the other end position of the actuation arm 700. As mentioned above, movement of the actuation arm 700 into the position shown in FIG. 16b may trigger another LED to light up to provide another visual indication that the power switch 140 has been tripped. It is also seen how the end of the second rocker arm 624 has moved closer to the second portion 176 of the toggle assembly 172 in the position of the tool 400' shown in FIG. 16b.

Figure 16C:
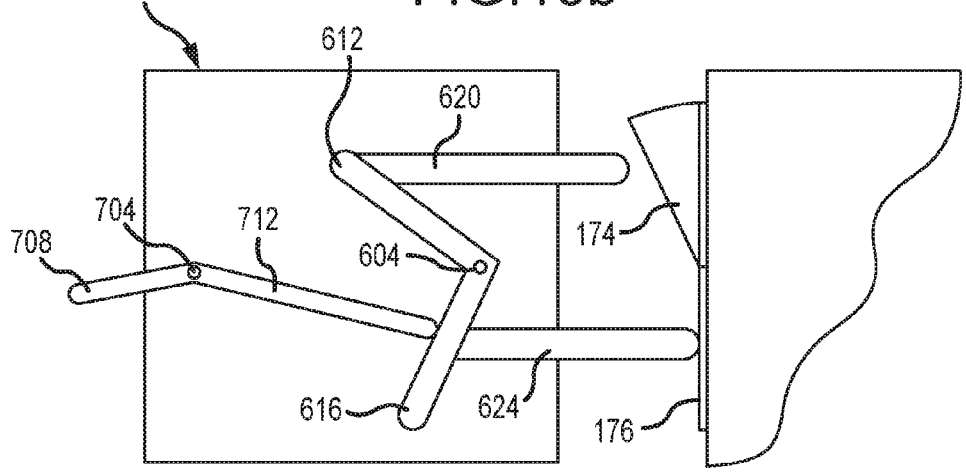
FIG. 16c is a front view of the power switch manipulation apparatus similar to FIG. 16b, but after a user has depressed an actuator of the apparatus to cause the apparatus to manipulate the power switch into an off or reset position.

To sequentially turn off and then turn on the power switch 140 (i.e., to reset the power switch 140), a user may again depress the first portion 708 back into the position shown in FIG. 16a. As shown in FIG. 16c, the end of the second portion 712 of the actuation arm 700 may initially ride up the second portion 616 of the rocker arm to initially pivot the rocker arm 608 in a counterclockwise direction and force the end of the second rocker leg 624 against the second portion 176 of the trigger assembly 172 and position the power switch 140 into an off position. As the user continues depressing the first portion 708 all the way into the position shown in FIG. 16a, the end of the second portion 712 eventually passes the pivot point 604 and rides onto the first portion 612 of the rocker arm 608 causing the rocker arm 608 to now pivot in an opposite clockwise direction which pushes the first rocker arm 620 against the first portion 174 of the toggle assembly 172 and pulls the second rocker arm 624 away from the second portion 176 of the toggle assembly 172. Again, the first LED may light up to indicate to a user that the power switch 140 is now in its on position.

Figure 17:
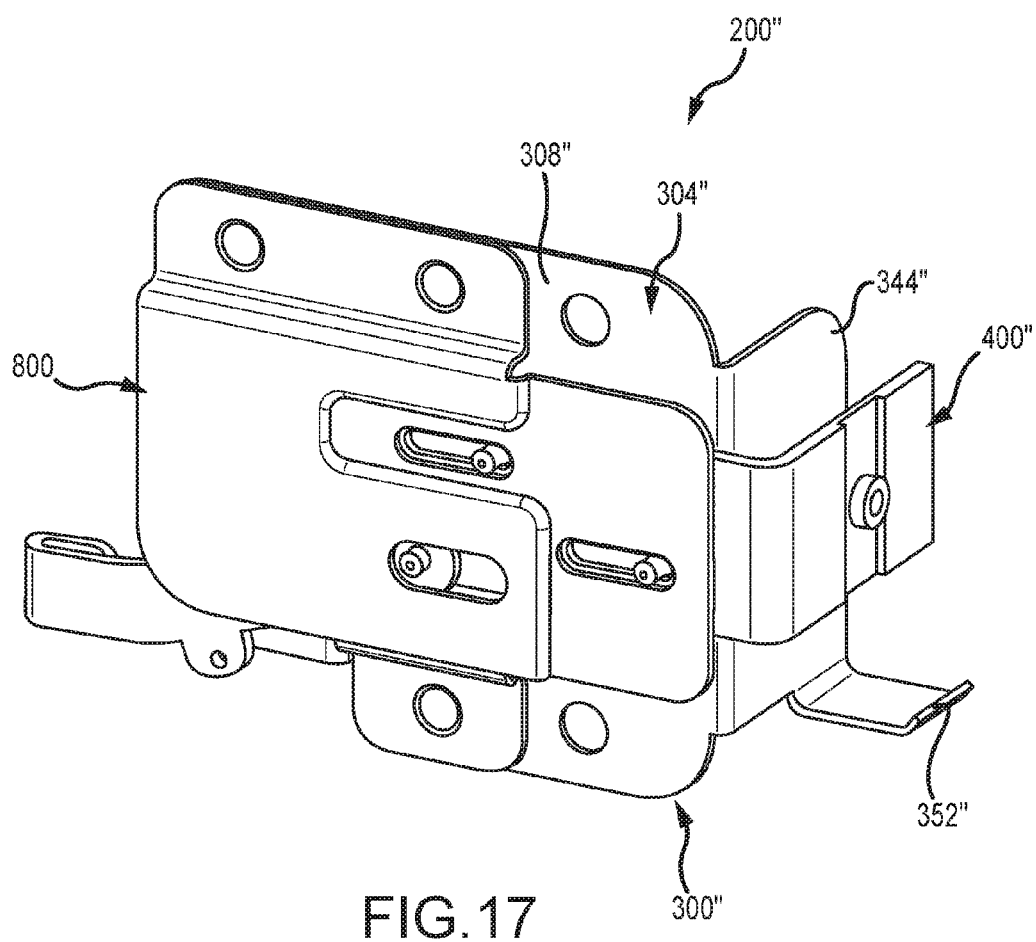
FIG. 17 is a perspective view of another embodiment of the power switch manipulation apparatus.

FIG. 17 illustrates another embodiment of the manipulation apparatus 200" that is configured to allow users to manipulate switches within the storage rack 100 free of having to physically reach into the storage rack 100 (e.g., into or through space 128 via rear opening 124) to manipulate the switches. Broadly, the manipulation apparatus 200" includes a base member 300" and a tool 400" that is movably mounted to the base member 300' in a manner that allows a user manipulate one of the switches. In one arrangement, the base member 300" may include a body 304" having at least a first leg 308" (e.g., bracket, sheet member, etc.) that may be appropriately rigidly or non-movably secured to the vertical member 152 similar to how the first leg 308 of the manipulation apparatus 200 may be secured to the vertical member (e.g., via inserting fasteners through apertures in the first leg 308", not labeled, and/or in other manners). As an example, the first leg 308" may be secured at height substantially the same as a height of a particular one of the power switches 140 in the storage rack 100. For instance, the body 304" may in one embodiment include a second leg 344" with an alignment member 352" (e.g., alignment member 352 of FIGS. 3 and 5) configured to catch on a portion of a power switch to facilitate location of the base member 300" adjacent the same The tool 400" may be in the form of a mechanical linkage movably attached to the body 304" of the base member 300" that is configured to manipulate the power switch 140 upon manipulation of the tool 400" by a user and that is configured to be manipulated by the power switch 140 upon tripping of the switch to provide a visual indication to a user of a tripped condition. Broadly, the tool 400" may include an assembly 900 including first and second arms 904, 908 that are pivotally attached to each other at a pivot point 912 (e.g., for pivotal movement of the first arm 904 relative to the second arm 908 about a pivot axis extending through the pivot about and into the page in FIGS. 18b and 19b). Pivotal movement of the first arm 904 is constrained in any appropriate manner, such as through a pin 916 of the first arm 904 being received for sliding movement within a slot 920 in the base member 300", or vice versa. Furthermore, the second arm 908 (e.g., a sliding member) is constrained to translation or sliding movement in a first direction towards a power switch and an opposite second direction away from the power switch such as through pins 924 of the base member 300" being received in slots 928 of the second arm 908, or vice versa.

The second arm 908 is configured to reach away from the pivot point 912 and the first arm 904 and into the vertical slot 156 in front of a power switch (e.g., not shown in FIGS. 17-19b, such as one of power switches 140 or a different type of power switch including a single button that may be depressed to turn the power switch on an that pops out when the switch has tripped). For instance, the second arm 908 may be in the form of one or more rigid bands, rods, brackets or the like having a first portion (not labeled) attached to the first arm 904 at the pivot point 912 and a second portion (not labeled) angled relative to the first portion (e.g., at a perpendicular angle as shown) to allow the first and second legs 620, 624 to reach into the vertical slot 156 in front of a power switch. In operation, a user may lift up on the first arm 904 to induce the second arm 908 to move in the first linear direction into contact with the power switch so as to depress a button or toggle member of the power switch into an on position. See FIGS. 19*a*-19*b* (where FIG. 19*b* has a cover member 800 removed for clarity). As can be seen, the tool 400" functions as a cam by converting pivotal movement of the first arm 904 about the pivot point 912 (as constrained via sliding of pin 916 in slot 920) in a first rotational direction (e.g., in a clockwise direction) into sliding movement of the second arm 908 (as constrained via sliding of pins 924 in slots 928) in a direction towards a power switch.

Figure 18A:
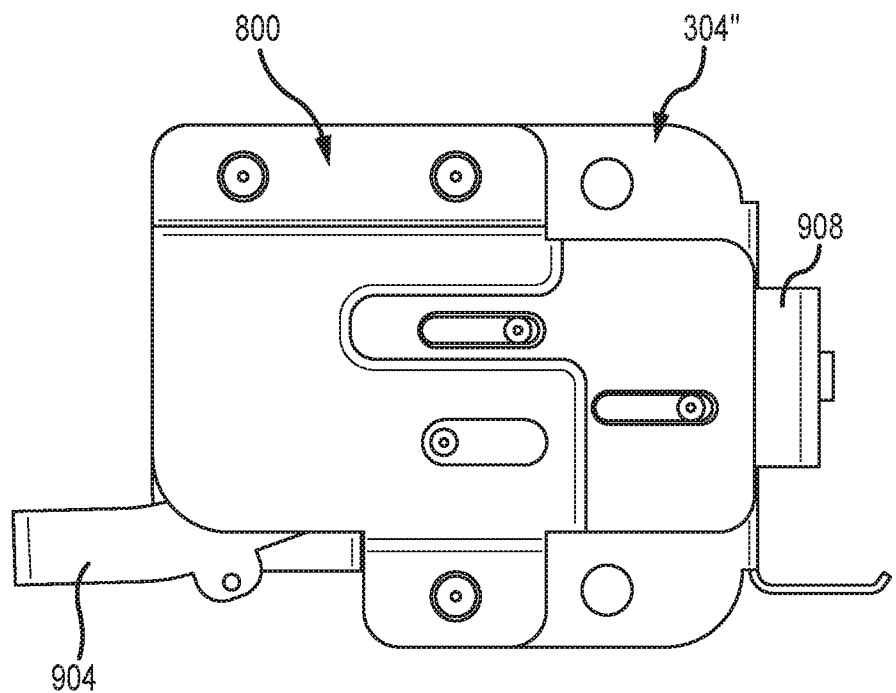
FIG. 18a is a front view of the power switch manipulation apparatus of FIG. 17.
Figure 18B:
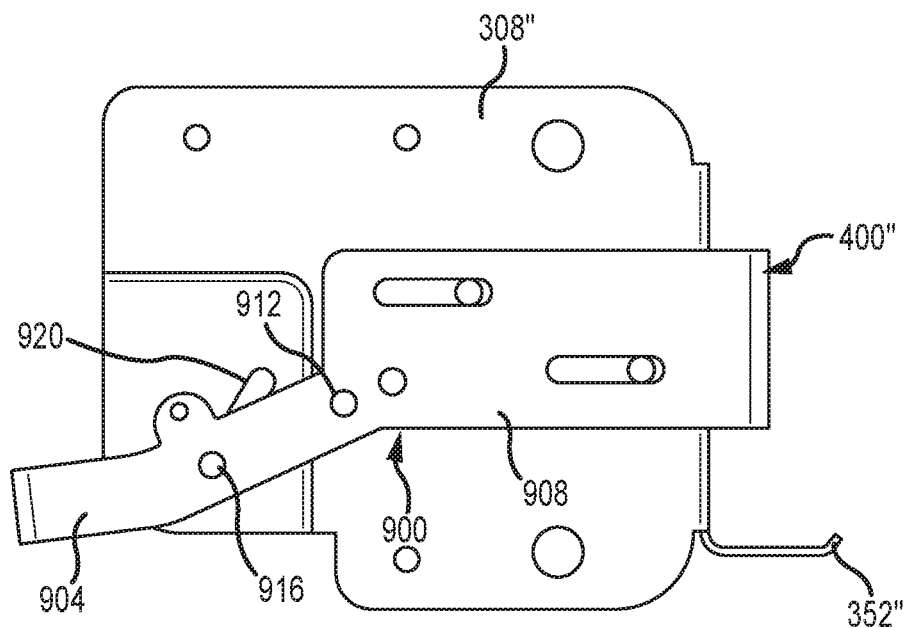
FIG. 18b is similar to FIG. 18a but with a covering of the apparatus being removed for clarity.
Figure 19A:
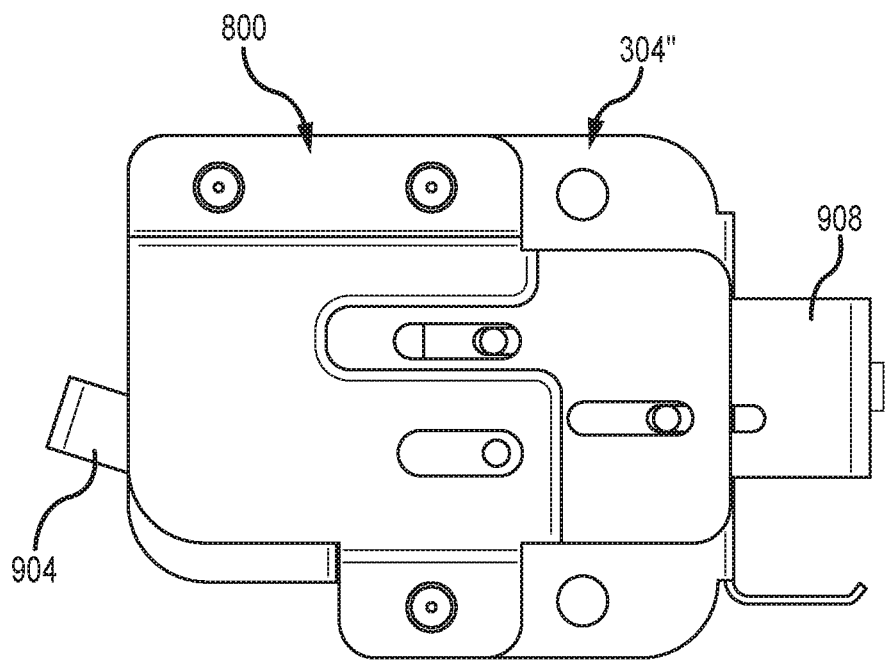
FIG. 19a is a front view of the power switch manipulation apparatus of FIG. 17, but with a tool in a different position.
Figure 19B:
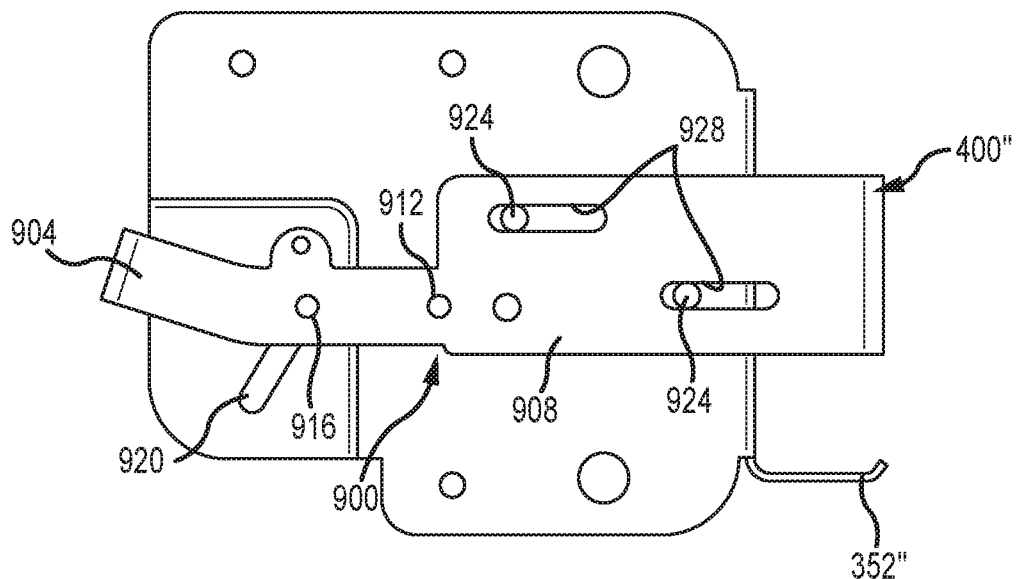
FIG. 19b is similar to FIG. 19a but with a covering of the apparatus being removed for clarity.

Upon the power switch tripping whereby the power switch pops out, the power switch pushes against the end of the second arm 908 to induce sliding of the second arm 908 in an opposite second direction. As the second arm 908 slides in the opposite direction, the second arm 908 induces the pin 920 to ride down the slot 916 to induce corresponding pivoting the first arm 904 in a second rotational direction (e.g., in a counterclockwise direction) into the depressed position shown in FIGS. 17 and 18*a*-18*b*. The depressed position of the first arm 904 of FIGS. 18*a*-18*b* provides a vision indication to a user that the power switch has tripped. To reset the power switch, the user may lift up on the first arm 904 into the position shown in FIGS. 19*a*-19*b* to cause the second arm 908 to again depress the power switch. While lifting of the first arm 904 has been discussed as causing the second arm 908 to depress the power switch into an on position and tripping of the power switch has been discussed as causing the second arm 908 to depress the first arm 904, the tool 400" could be appropriately arranged vice versa whereby a user depresses the first arm 904 to turn the power switch on and the first arm 904 lifts up in a tripped state of the power switch.

FIGS. 23-32 illustrate another embodiment of the manipulation apparatus 200''' that is configured to allow users to manipulate switches within the storage rack 100, such as one or more of the power switches 140 of the PDU 132, free of having to physically reach into the storage rack 100 (e.g., into or through space 128 via rear opening 124) to manipulate the power switches 140. Broadly, the manipulation apparatus 200''' includes a base member 300''' and a tool assembly 400''' (e.g. manipulation assembly) that is movably mounted to the base member 300''' in a manner that allows a user manipulate one of the power switches 140. In one arrangement, the base member 300''' may include a body 304''' having at least a first leg 308''' (e.g., bracket, sheet member, etc.) that may be appropriately rigidly or non-movably secured to the vertical member 152 similar to how the first leg 308 of the manipulation apparatus 200 may be secured to the vertical member (e.g., via inserting fasteners through apertures in the first leg 308''', not labeled, and/or in other manners). For instance, the first leg 308''' may be secured at a height substantially the same as that of a particular one of the power switches 140 in the storage rack 100. In one embodiment, the body 304''' may include a second leg 344" with an alignment member 352''' (e.g., alignment member 352 of FIGS. 3 and 5) configured to catch on a portion of a power switch (e.g. lower edge of power switch) to facilitate location of the base member 300''' adjacent the same The tool assembly 400''' may broadly be in the form of at least first and second independently manipulatable tools 1004, 1008 that are each constrained to a single degree of motion relative to the base member 300''' (e.g., each being constructed to movement within or parallel to a single plane) for purposes of manipulating and/or being manipulated by a power switch 140. In one arrangement, the first tool 1004 may be in the form of a bracket that is slidably attached to the body 304''' of the base member 300''', such that urging (e.g., pushing by an operator) of the first tool 1004 in a first direction towards the power switch 140 (e.g., in the y or front/back dimension) is configured to manipulate the first portion 174 of the power switch 140 into an on position of the power switch 140 while urging of the first tool 1004 (e.g., by the first portion 174 of the power switch 140) in an opposite second direction away from the power switch (e.g., upon tripping of the first portion 174 or upon manipulation of the second portion 176 by the second tool 1008, discussed below) is configured to indicate to an operator that the power switch has tripped or has been manipulated into an off position (e.g., by virtue of the position of the first tool 1004 relative to that of the second tool 1008).

For instance, the first tool 1004 may include a body 1012 including at least a first arm 1016 that is slidable (e.g., translatable, reciprocable) along or parallel to a first axis 1100 (e.g., that is parallel to the y-axis or front/back dimension) relative to the base member 300''' in a first direction generally towards the power switch 140 (e.g., generally towards an interior of the storage rack 100) and in an opposite second direction generally away from the power switch (e.g., towards an exterior of the storage rack 100). A longitudinal axis of the first arm 1012 may be collinear with or generally parallel to the first axis 1100. For instance, the first arm 1016 may be in the form an elongated member (e.g., band, rod, bracket, etc.) having a cross-sectional shape and size that allows it slide or translate along the first axis 1100 but that inhibits rotation of the first arm about the first axis 1100 and/or its longitudinal axis. In one arrangement, the first arm 1016 may be of a length substantially equal to or greater than a distance between the rear opening 124 and the vertical slot 156 (e.g., or other location where the switch 140 is located).

The body 1012 of the first tool 1004 may also include a second arm 1020 that is rigidly attached to or at least non-movable relative to the first arm 1016 such that movement of the first arm 1016 along the first axis 1100 in a first direction along the y-dimension induces corresponding movement of the second arm 1020 in the first direction along the y-dimension. In one arrangement, the second arm 1020 may be rigidly attached to a second of first and second ends 1017, 1018 of the first arm 1016 and non-movably attached thereto at a non-parallel (e.g. perpendicular, 45°, etc.) angle so that the second arm 1020 "reaches into" the vertical slot 156 at a position in front of the switch 140 (e.g., in front of the first/on portion 174 of the switch 140). In one arrangement, the body 1012 may be a single piece of material (e.g., bar stock, rod, etc.) that is appropriately bent to form at least the first and second arms 1016, 1020. In other arrangements, the first and second arms 1016, 1020 may be separate pieces that are appropriately rigidly attached together. In further arrangements, one or more additional arms may rigidly and non-movably interconnect the first arm 1016 to the second arm 1020.

The second tool 1008 may be in the form of a bracket that is slidably attached to the body 304''' of the base member 300''' for movement towards and away from the second portion 176 (the "off" portion) of the power switch 140 to allow an operator to manipulate power switch 140 into an off position. For instance, the second tool 1008 may include a body 1024 including at least a first arm 1028 that is slidable (e.g., translatable, reciprocable) along or parallel to a second axis 1200 (e.g., that is parallel to the y-axis or front/back dimension) relative to the base member 300''' in a first direction generally towards the power switch 140 (e.g., generally towards an interior of the storage rack 100) and in an opposite second direction generally away from the power switch (e.g., towards an exterior of the storage rack 100). A longitudinal axis of the first arm 1024 may be collinear with or generally parallel to the first axis 1200. The first and second axes 1100, 1200 may be parallel.

The second tool 1008 may also include a second arm 1032 that is rigidly attached to or at least non-movable relative to the first arm 1028 such that movement of the first arm 1028 along the first axis 1200 in a first direction along the y-dimension induces corresponding movement of the second arm 1032 in the first direction along the y-dimension. For instance, the second arm 1032 may be rigidly attached to a second of first and second ends 1029, 1030 of the first arm 1028 and non-movably attached thereto at a non-parallel (e.g. perpendicular, 45°, etc.) angle so that the second arm 1032 "reaches into" the vertical slot 156 at a position in front of the switch 140 (e.g., in front of the second/off portion 176 of the switch 140). Like the first tool 1004, the second tool 1008 may be constructed in any appropriate manner and of any appropriate materials to allow the second tool 1008 to slidably travel in the single degree motion.

In one arrangement, the bodies 1012, 1024 of the first and second tools 1004, 1008 be identical for facilitating assembly of the manipulation apparatus 200''' (e.g., such as when the first and second portions 174, 176 of the power switch 140 are in a common plane in which the x and z dimensions both reside). However, it is to be understood that the dimensions and/or geometries of the first and second tools 1004, 1008 (e.g., lengths of first arms 1016, 1028, shape of bends of second arms 1020, 1032, etc.) may be adjusted as appropriate to allow the first and second tools 1004, 1008 to manipulate power switches 140 of different geometries, positions, etc.

The base member 300''' may include first and second guide channels $320_1'''$, $320_2'''$ for respectively receiving the first arms 1016, 1028 of the first and second tools 1004, 1008 and confining movement of the first arms 1016, 1028 to sliding movement along the respective first and second axes 1100, 1200 in the first and second opposite directions (e.g., by way of limiting or preventing movement of the first and second tools 1004, 1008 in the z or up/down dimension). For instance, the first and second guide channels $320_1'''$, $320_2'''$ may each be defined by upper and lower guide members 3289''', 332''' that are configured respectively contact or nearly contact upper and lower edges (not labeled) of the respective first arms 1016, 1028. In one arrangement, the upper and lower guide members 328''', 332''' may extend away from the first leg 308''' of the base member 300''', such as at a perpendicular or nearly perpendicular angle relative to the first leg 308''. As just one example, each of the guide members 328''', 332''' may be a portion of the first leg 308''' that is appropriately bent or manipulated away from a main body of the first leg 308''' to form the first and second guide channels $320_1'''$, $320_2'$.

The first tool 1004 may be biased along the first axis 1100 in the first direction (generally towards the power switch 140) by a first biasing force that is enough to press the first tool 1004 (e.g., the second arm 1020) against or at least towards the first portion 174 of the power switch 140 but short of enough to manipulate (e.g., press) the first portion 174 of the power switch 140 into an on position of the power switch 140. A user may press the first end 1017 of the first arm 1016 of the first tool 1004 in the first direction to overcome the resistance of the first portion 174 of the power switch 140 to manipulate the same into the on position. The first biasing force then maintains the second arm 1020 of the first tool 1004 against the first portion 174 of the power switch 140 in the on position until the first biasing force is overcome by the first portion 174 of the switch 140 pressing back against the second arm 1020 to move the first tool 1004 in the opposite second direction upon the power switch 140 tripping or a user pressing the second tool 1008 in the first direction to manipulate the second (e.g., off) portion 176 of the power switch 140 (discussed in more detail below).

The first biasing force may be provided by a first biasing member 1036 (e.g., spring) that is connected or positioned between a first connection surface (e.g., projection, protrusion, recess, etc.) 366''' of the base member 300''' that may generally extend in the first direction towards the power switch 140 (where the first connection surface 366''' is non-movable relative to the first leg 308''' and the base member 300''' as a whole), and a connection surface (e.g., projection, etc.) 1040 of the first tool 1004 that generally extends in the second direction away from the power switch 140. In one arrangement, the first connection surface 366''' of the base member 300''' may extend from a portion of the upper guide member 328''' of the first guide channel $320_1'''$. In any case, a first end of the first biasing member 1036 is generally fixed against the first connection surface 366''' of the base member 300''' and is thus non-moveable relative to the base member 300''', while an opposite second end of the first biasing member 1036 is fixed against the connection surface 1040 of the first tool 1004 but movable relative to the base member 300''' to urge the first tool 1004 in the first direction. That is, the first biasing member 1036 may push off of the first connection surface 366' of the base member 300''' to bias the first tool 1004 in the first direction.

In one arrangement, the first biasing member 1036 may be in the form of a compression spring that urges the second arm 1020 of the first tool 1004 against the first portion 174 of the power switch 140 (but not, as discussed above, enough to actually manipulate the first portion 174 free of a user pressing on the first tool 1004. After the user has pressed the first tool 1004 to manipulate the first portion 174 into the on position, the compression spring may maintain the second arm 1020 of the first tool against the first portion 174 (e.g., by a force that may be overcome by the force generated by the first portion 174 against the second arm 1020 upon tripping of the first portion 174. In another arrangement, the first biasing member 1036 may be in the form of an extension spring that is configured pull or retract the first tool 1004 slightly away from the first portion 174 of the power switch 140 after a user has pressed the first tool 1004 to manipulate the first portion 174. In the first position of the first tool 1004 in FIG. 32a, for instance, where the first portion 174 is in the off position, the first portion 174 may be pressing against the second arm 1020 of the first tool 1004 to position the extension spring into an at least slightly compressed position from its normal resting or non-biased position.

When a user subsequently depresses the first tool 1004 to turn on the power switch 140, the built up potential energy in the spring urges the first tool 1004 in the first direction along the axis 1100 towards the switch 140 until the spring reaches its resting or non-biased position (which corresponds to a third position of the first tool 1004, discussed below) which occurs before the first portion 174 has been manipulated into its on position. In this regard, the continued movement of the first tool 1004 into a second position needed to manipulate the first portion into its on position (e.g., as in FIG. 32b) serves to stretch the spring and build up potential energy in the spring. Upon release of the first tool 1004 by the user after the first portion 174 has been manipulated into the on position, the built-up potential energy automatically retracts the first tool 1004 away from the first portion 174 into a third position of the first tool 1004 between the first and second positions to leave a gap between the second arm 1020 of the first tool 1004 and the first portion 174 of the power switch 140 (gap not shown in Figures). In one arrangement, the gap may be of a size large enough to allow the first portion 174 to "pop out" a distance necessary to at least stop the flow of electricity through the circuit within which the power switch 140 is connected upon tripping of the power switch 140 in a substantially unimpeded manner (i.e., unimpeded by the first tool 1004). After the circuit has been cut, the continued popping out of the first portion 174 serves to compress the spring to again store potential energy in the same.

The second tool 1008 may rest in a non-biased position in contact with or slightly spaced away from the second portion 176 of the power switch 140. Upon a user depressing the second tool 1008 to depress/manipulate the second portion 176 to turn off the power switch 140 and then releasing the second tool 1008, a second biasing force may bias the second tool 1008 back along the second axis 1200 in the second direction. For instance, the second biasing force may be provided by a second biasing member 1044 (e.g., spring) that is connected or positioned between a second connection surface (e.g., projection, protrusion, recess, depression, etc.) 370''' of the base member 300''' that may generally extend in the second direction away from the power switch 140 (where the second connection surface 370''' is non-movable relative to the first leg 308''' and the base member 300''' as a whole), and a connection surface (e.g., projection) 1048 of the second tool 1008 that generally extends in the first direction towards the power switch 140. In one arrangement, the second connection surface 370''' of the base member 300''' may extend from a portion of the lower guide member 332''' of the second guide channel 320₂'''. In any case, a first end of the second biasing member 1044 is generally fixed against the second connection surface 370''' of the base member 300''' and is thus non-moveable relative to the base member 300''', while an opposite second end of the second biasing member 1044 is fixed against the connection surface 1048 of the second tool 1008 but movable relative to the base member 300''' to urge the second tool 1008 in the second direction. The second biasing member 1044 may be in the form of a compression or extension spring for instance.

In one arrangement, each of the first and second tools 1004, 1008 may include both of the protrusions 1040, 1048 (where the protrusions 1040, 1048 extend or point in opposite directions) as shown in the figures, even though, in one embodiment only the protrusion 1040 may be utilized for the first tool 1004 and only the protrusion 1048 may be utilized for the second tool 1008. This arrangement advantageously allows the directions of the biasing forces of the first and second tools 1004, 1008 to be reversed if needed to account for changes in the relative locations of the first and second portions 174, 176 of the switch 140. In this case, additional corresponding protrusions could be added to the base member 300'''.

In any case, a cover member 1300 may be appropriately secured over the first leg 308''' of the base member 300''' to contain or protect the first legs 1016, 1028 of the first and second tools 1004, 1004 and the first and second biasing members 1036, 1044 between the cover member 1300 and the first leg 308''' and limit or prevent movement of the first and second legs in the x or side to side dimension. As just one example, the cover member 1300 may be in the form of a bracket, plate, and/or the like having the same or similar y and z dimensions to those of the first leg 308''' of the base member 300''' and that may be fixedly secured thereto in any appropriate manner (e.g., such as via extending rivets or the like through aligned apertures in the first leg 308''' and the cover member 1300). In one arrangement, the cover member 1300 may include first and second extensions (e.g., protrusions, ribs, etc.) 1304, 1308 extending from an inside surface thereof respectively towards the first arms 1016, 1028 of the first and second tools 1004, 1008 that are configured to contact (e.g., press against) or nearly contact the first arms 1016, 1028 when the cover member 1300 is secured to the base member 300''' to limit or prevent x or side to side movement of the first and second tools 1004, 1008 (but to still allow for y or front/back movement of the first and second tools 1004, 1008 along or parallel to the first and second axes 1100, 1200).

Additionally or alternatively, the cover member 1300 may include pairs of front and rear slots 1312, 1316 through which the first arms 1016, 1028 of the first and second tools 1004, 1008 are configured to slide in the y or front to back dimension. In addition to constraining motion of the first and second tools 1004, 1008 to sliding motion in the y dimension, the slots (e.g., the rear slots 1316) also advantageously prevent or limit over-travel (or otherwise set a maximum limit on travel in the first direction towards the power switch 140) of the first and second tools 1004, 1008 in the first direction towards the power switch 140 (e.g., via engagement between edges of the slots and corresponding structures on the first and second tools 1004, 1008 (e.g., such as steps, ridges or protrusions on the first arms 1020, 1028 of the first and second tools 1004, 1008, not labeled).

To facilitate the reader's understanding of the various functionalities of the power switch manipulation apparatus 200''', one method of installation and use of the apparatus 200''' will now be discussed although it is to be understood that other methods (including more, fewer, or different steps than those specifically discussed) consistent with the teachings presented herein are also envisioned and encompassed in the present disclosure. Initially, the first and second biasing members 1036, 1044 may be appropriately attached to the base member 300''' such as by fitting a first end of the first biasing member 1036 over the protrusion 1040 of the first tool 1004 and a first end of the second biasing member 1044 over the protrusion 1048 of the second tool 1008. The first and second tools 1004, 1008 may then be respectively inserted into the first and second guide channels 320₁''', 320₂''' of the base member 300''' and the second ends of the first and second biasing members 1036, 1044 may be respectively fitted over the first and second protrusions 366''', 370''' of the base member 300'''. Of course, the first and second biasing members 1036, 1044 may be first fitted over the first and second protrusions 366''', 370''' of the base member 300''', and then the first and second tools 1004, 1008 may be inserted into the first and second guide channels 320₁''', 320₂''' and the first and second biasing members 1036, 1044 fitted over the protrusions 1040, 1048 of the first and second tools 1004, 1008.

In any event, the cover member 1300 may then be positioned over the first and second tools 1004, 1008 and first and second biasing members 1036, 1044 and secured to the first leg 308''' of the base member 300'''. As just one example, apertures 1320 through the cover member 1300 may be aligned with corresponding apertures 313''' through the first leg 308''' of the base member 300''' and fasteners (e.g., rivets, etc.) may be passed through the aligned sets of apertures to secure the cover member 1300 to the base member 300'''. As discussed previously, the cover member 1300 serves to protect and contact the first and second tools 1004, 1008 and first and second biasing members 1036, 1044 as well as constrain motion of the first and second tools 1004, 1008 along or parallel to the first and second axes 1100, 1200 (e.g., to a single degree of motion, such as sliding motion in first and second opposite directions in the y-dimension).

A user may then insert the second leg 344''' of the base member 300''' into the storage rack 100, guide it into the vertical slot 156 between adjacent power switches 140, and press the first leg 308''' substantially flush against the front surface 168 of the vertical member 152. The user may then slide the base member 300''' upwards until the alignment tab 352''' catches on a power switch 140 (e.g., a bottom edge of the power switch 140) at which point the user may rigidly secure the base member 300''' to the vertical member 152 (e.g., such as by inserting fasteners through apertures 1324 in the cover member 1300 and through apertures 312''' in the first leg 308 and into the vertical member 152, and/or in other manners). In one arrangement, the alignment tab 352''' may be positioned on the second leg 344''' in a manner that allows a user to slide the base member 300''' downwardly until the alignment tab 352''' catches on a top portion of a power switch 140 instead of the bottom portion (e.g., when the alignment tab 352''' extends from a top portion of the second leg 344''' instead of a bottom portion as shown in the figures). In any case, the user may repeat the above process with additional base members 300''' for additional power switches 140 in the storage rack 100. At this point, the first biasing force provided by the first biasing member 1036 may automatically urge the first tool 1004 (e.g., the second arm 1020 of the first tool) against and into contact with the first portion 174 of the power switch 140 but free of manipulating the first portion 174 into the on position of the power switch 140.

Figure 32A:
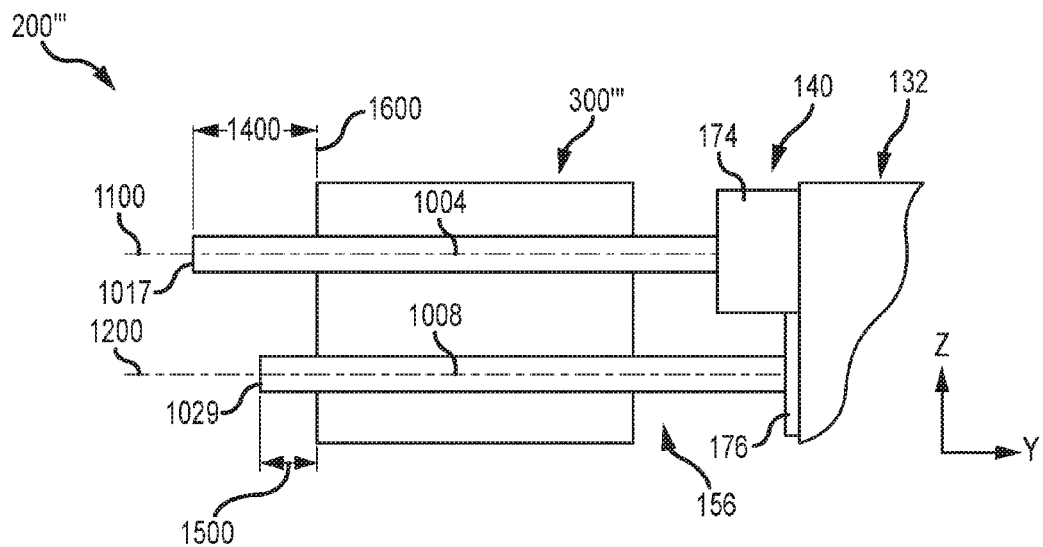
FIG. 32a is a schematic illustration of the power switch manipulation apparatus of FIG. 23 with first and second tools of the apparatus being in a first staggered relationship relative to each other and the power switch being in an off condition.

FIG. 32a presents a schematic illustration of the power switch manipulation apparatus 200''' and the power switch 140 being in an off condition. Specifically, the first portion 174 of the power switch is popped out to the off position and the first tool 1004 is in contact with the first portion 174. Furthermore, the first and second tools 1004, 1008 are in a first staggered relationship relative to each other indicating to a user that the power switch 140 is in the off position. For instance, the first end 1017 of the first arm 1016 of the first tool 1004 may be a first distance 1400 from a fixed vertical reference plane 1600 on the front of the rack 100 that is perpendicular to the first and second axes 1100, 1200 (e.g., where the reference plane 1600 extends within the x and z dimensions), and the first end 1029 of the first arm 1028 of the second tool 1008 may be a first distance 1500 from the vertical reference plane 1600, where the first distance 1400 is greater than the first distance 1500. The first staggered configuration of the first and second tools 1004, 1008 provides a visual indication to an operator that the power switch 140 is off even though the user may not be able to see the power switch 140 or be able to physically touch the power switch 140 due to the location of the power switch 140.

Figure 32B:
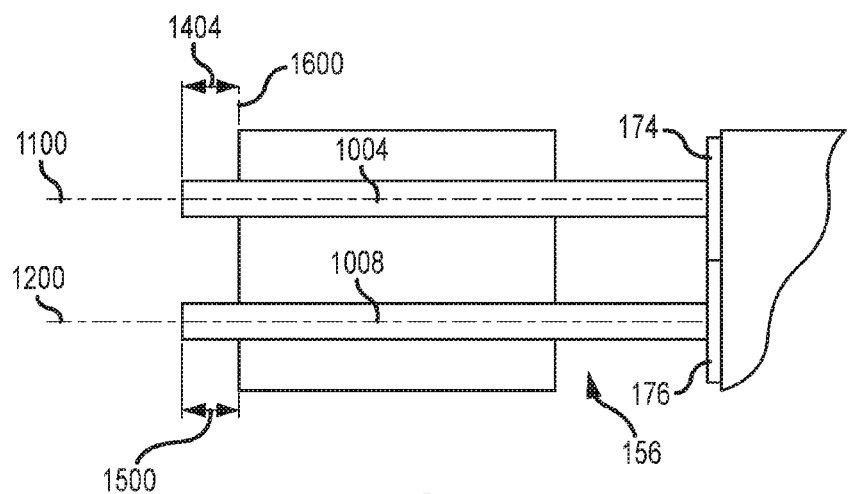
FIG. 32b is a schematic illustration of the power switch manipulation apparatus of FIG. 23 with the first and second tools being in an aligned relationship relative to each other and the power switch being in an on condition.

To turn the power switch 140 on, the user may then depress or push (e.g., urge) the first tool 1004 (e.g., the first end 1017) in the first direction along the first axis 1100 towards the power switch 140 to overcome the resistance being provided by the first portion 174 and depress the first portion 174 into the on position. With reference to FIGS. 32a-32b, the first tool 1004 moves from a first position to a second position. At this point, the first and second tools 1004, 1008 may be in a generally aligned relationship, where the first end 1017 of the first arm 1016 of the first tool 1004 may be a second distance 1404 from a fixed vertical reference plane 1600 which is substantially equal to the first distance 1500 of the first end 1029 of the second tool 1008 to provide a visual indication to the user and/or operators that the power switch 140 is in an on position.

To turn the power switch 140 off, the user may depress or push (e.g., urge) the second tool 1008 (e.g., the first end 1029) in the first direction along the second axis 1200 towards the power switch 140 to depress the second portion 176 of the power switch 140 and position the power switch into an off position. For instance, the second arm 1032 of the second tool 1008 may overcome any resistance being provided by the second portion 176 and depress the second portion 176 which correspondingly causes or induces the first portion 174 of the power switch 140 to pop out in the second direction parallel to the first axis 1100, thus applying a force to the first tool 1004 that moves the first tool in the second direction along or parallel to the first axis 1100 back into the position illustrated in FIG. 32a (where the first staggered relationship of FIG. 32a provides the visual indication to the user of the off position of the power switch 140). After depressing the second tool 1008 in the first direction to power off the power switch 140, the second biasing force provided by the second biasing member 1044 may apply a force against the second tool 1008 (e.g., against the second arm 1032) that urges the second tool 1008 back along or parallel to the second axis 1200 in the second direction into or near the position shown in FIGS. 32a-32b.

With reference again to FIG. 32b, and in the event that the power switch 140 trips, the first portion 174 of the power switch 140 may automatically pop out in the second direction back into the position shown in FIG. 32a. In this case, popping out of the first portion 174 generates a force that urges the first tool 1008 in the second direction along or parallel to the first axis against the first biasing force into the position shown in FIG. 32a. As can be seen, the first and second tools 1004, 1008 may now again assume a first staggered configuration which provides a visual indication to a user that the power switch 140 has tripped. To reset the power switch 140 and turn it back on, the user may again depress the first tool 1004 to depress (e.g., engage, manipulate) the first portion 174.

While a particular staggered configuration of the first and second tools 1004, 1008 has been shown and described for visually indicating to a user a state (e.g., off, on, tripped) of the power switch 140, it is to be understood that the dimensions, geometries, etc. of the first and second tools 1004, 1008, of the base member 300''', etc. may be appropriately altered so that different configurations of the first and second tools 1004, 1008 (staggered, non-staggered) visually indicate different states of the power switch 140. For instance, the apparatus 200''' may be configured so that an aligned configuration of the first and second tools (e.g., where the first ends 1017, 1029 are the same distance from the vertical reference plane 1600) indicates an off position of the power switch 140 (e.g., when the first arm 1016 of the first tool 1004 is shorter than the first arm 1028 of the second tool 1008) and a first staggered configuration where the distance between the first arm 1016 of the first tool 1004 and the vertical reference plane 1600 is less than that between the first arm 1028 of the second tool 1008 and the vertical reference plane 1600 indicates an on or tripped position of the power switch 140.

Other arrangements for limiting movement of the first and second tools 1004, 1008 to a single degree of motion (e.g., sliding motion) are also envisioned. For instance, each of the first and second tools 1004, 1008 may have a non-circular cross section that slides through a correspondingly shaped aperture of the base member 300'''. Also, while the single degree of motion (sliding motion) of the first and second tools 1004, 1008 has been discussed as being within the y-dimension, it is also envisioned that the single degree of motion could be in other dimensions (e.g., x, z) depending upon the particular position and orientation of the power switch 140.

The various manipulation apparatuses (e.g., 200, 200', 200'', 200''') disclosed herein may have reduced form factors in one or both of the x-dimension (e.g., horizontal direction along rear opening 124 of rack 100) and the z-dimension (e.g., vertical dimension) to allow the apparatuses to be used in storage racks having limited openings or passageways for users to physically reach into the racks to manipulate power switches or circuit breakers. For instance, the base members may be in the form of sheet members (e.g., sheet metal) having reduced thicknesses so as to protrude limited or reduced amounts into the interior space of the storage racks. Furthermore, the tools disclosed herein may also be in the form of sheet members, thin brackets or rods, or the like having reduced thicknesses so as to protrude limited or reduced amounts into the interior space of the storage racks.

Still further, the base members may include one or more features that are specifically configured to guide the tools to be directly in front of a power switch so that the user can use a handle or other portion of the tool to manipulate the power switch (e.g., into an on or off position) free of the user having to physically reach into the rack to manipulate the power switch. While the manipulation apparatuses disclosed herein have been discussed as being mounted adjacent the rear opening 124 of the rack 100 for manipulating power switches near the rear of the rack, it is to be understood that the various manipulation apparatuses may be appropriately located in other portions of the rack where access to power switches with limited physical access openings or passageways is needed (e.g., front or side portions of the rack 100).

It will be readily appreciated that many additions and/or deviations may be made from the specific embodiments disclosed in the specification without departing from the spirit and scope of the invention. The illustrations and discussion herein has only been provided to assist the reader in understanding the various aspects of the present disclosure. Furthermore, one or more various combinations of the above discussed arrangements and embodiments are also envisioned.

While this specification contains many specifics, these should not be construed as limitations on the scope of the disclosure or of what may be claimed, but rather as descriptions of features specific to particular embodiments of the disclosure. Furthermore, certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and/or parallel processing may be advantageous. Moreover, the separation of various system components in the embodiments described above should not be understood as requiring such separation in all embodiments, and it should be understood that the described program components and systems can generally be integrated together in a single software and/or hardware product or packaged into multiple software and/or hardware products.

The above described embodiments including the preferred embodiment and the best mode of the invention known to the inventor at the time of filing are given by illustrative examples only.

What is claimed is:

1. A system for manipulating a power switch of an electronic device, comprising:
   a base member that is non-movably attachable relative to a power switch of an electronic device; and
   a manipulation assembly movably mountable to the base member for manipulating the power switch of the electronic device, wherein the manipulation assembly includes:
      a first tool slidably attached to the base member for movement relative to the base member along a first axis in a first direction towards the power switch to manipulate the power switch into an on position and along the first axis in an opposite second direction away from the power switch when manipulated by the power switch; and
      a second tool slidably attached to the base member for movement relative to the base member along a second axis to manipulate the power switch into an off position.

2. The system of claim 1, wherein the first and second axes are parallel.

3. The system of claim 1, wherein the first and second tools are respectively non-rotatable about the first and second axes.

4. The system of claim 1, wherein the first tool includes a first arm having a longitudinal axis that is collinear with or parallel to the first axis, wherein the first tool includes a second arm that is non-movable relative to the first arm and configured to contact the power switch.

5. The system of claim 1, wherein the first tool is biased with a first biasing force along the first axis in the first direction towards the power switch.

6. The system of claim 5, further including a first biasing member interconnected between the first tool and the base member for providing the first biasing force.

7. The system of claim 6, wherein the base member includes a first connection surface that extends along the first axis in the first direction, wherein the first tool includes a connection surface that extends along the first axis in the second direction, and wherein the first biasing member is connected between the first connection surface of the base member and the connection surface of the first tool.

8. The system of claim 7, wherein the second tool is biased with a second biasing force along the second axis in the second direction away from the power switch.

9. The system of claim 8, further including a second biasing member interconnected between the second tool and the base member for providing the second biasing force.

10. The system of claim 9, wherein the base member includes a second connection surface that extends along the second axis in the second direction, wherein the second tool includes a connection surface that extends along the second axis in the first direction, and wherein the second biasing member is connected between the second connection surface of the base member and the connection surface of the second tool.

11. The system of claim 10, wherein the base member includes a sheet member that extends in a first plane that is parallel to the first and second axes, wherein each of the first and second connection surfaces extends from the sheet member in a third direction.

12. The system of claim 11, further including a cover member attached to the base member, wherein the first and second tools are secured between the cover member and the base member for respective movement along the first and second axes.

13. A method of manipulating a power switch of an electronic device mounted in a storage rack, comprising:
    urging a first tool along a first axis in a first direction from a first position of the first tool into a second position of the first tool to manipulate a first portion of the power switch into an on position of the power switch, wherein a first end of the first tool is a first distance from a vertical reference plane that is perpendicular to the first axis in the first position, wherein the first end of the first tool is a second distance from the vertical reference plane in the second position that is less than the first distance, wherein a first end of a second tool that is slidable along a second axis that is parallel to the first axis is a first distance from the vertical reference plane when the first tool is in the second position, and wherein the first distance of the first end of the second tool is equal to the second distance of the first end of the first tool.

14. The method of claim 13, further including:
    releasing the first tool after urging the first tool into the second position; and
    allowing a biasing member to urge the first tool along the first axis in the second direction from the second position of the first tool into a third position of the first tool between the first and second positions of the first tool.

15. The method of claim 13, further including:
    receiving, on the first tool, a force from the first portion of the power switch that urges the first tool along the first axis in a second direction that is opposite to the first direction.

16. The method of claim 15, further including:
    generating the force upon tripping of the power switch.

17. The method of claim 15, wherein the receiving includes receiving, on the first tool, a force from the first portion of the power switch that urges the first tool along the first axis in a second direction that is opposite to the first direction into the first position of the first tool.

18. The method of claim 15, further including:
    urging the second tool along the second axis in the first direction from a first position of the second tool into a second position of the second tool to manipulate a second portion of the power switch into an off position of the power switch, wherein the force is generated during the urging of the second tool into the second position of the second tool.

19. The method of claim 18, further including:
    releasing the second tool; and
    allowing a biasing member to urge the second tool along the second axis in the second direction from the second position of the second tool into the first position of the second tool.

20. A storage rack, including:
    a frame defining an interior space for receiving a plurality of computing devices; and
    a system secured to the frame for manipulating a power switch of an electronic device of the storage rack, comprising:
        a base member rigidly attached to the frame and being non-movable relative to a power switch of an electronic device;
        a first tool slidably attached to the base member for movement relative to the base member along a first axis in a first direction towards the power switch to manipulate the power switch into an on position and along the first axis in an opposite second direction away from the power switch when manipulated by the power switch; and
        a second tool slidably attached to the base member for movement relative to the base member along a second axis to manipulate the power switch into an off position.

* * * * *

UNITED STATES PATENT AND TRADEMARK OFFICE
CERTIFICATE OF CORRECTION

PATENT NO. : 9,894,797 B2  
APPLICATION NO. : 14/997025  
DATED : February 13, 2018  
INVENTOR(S) : Sampath Page 1 of 1

It is certified that error appears in the above-identified patent and that said Letters Patent is hereby corrected as shown below:

In the Specification

In Column 20, Line 40, after "same" insert -- . --.

In Column 22, Line 3, after "same" insert -- . --.

In Column 23, Line 57, delete "3289'"," and insert -- 328'", --, therefor.

Signed and Sealed this  
Ninth Day of October, 2018

Andrei Iancu  
*Director of the United States Patent and Trademark Office*